United States Patent
Yeo et al.

(10) Patent No.: US 8,736,317 B2
(45) Date of Patent: May 27, 2014

(54) FREQUENCY DIVIDER AND PHASE LOCKED LOOP INCLUDING THE SAME

(75) Inventors: Hwan-Seok Yeo, Seongnam-si (KR); Ji-Hyun Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 61 days.

(21) Appl. No.: 13/535,424

(22) Filed: Jun. 28, 2012

(65) Prior Publication Data

US 2013/0002319 A1 Jan. 3, 2013

(30) Foreign Application Priority Data

Jun. 29, 2011 (KR) ........................ 10-2011-0063687

(51) Int. Cl.
*H03K 23/00* (2006.01)
*H03K 21/00* (2006.01)

(52) U.S. Cl.
USPC .............................. 327/115; 327/118; 377/47

(58) Field of Classification Search
CPC ...... H03K 21/00–21/406; H03K 23/00–23/86; H03L 7/18
USPC ............... 327/113–115, 117, 118; 377/47, 48
See application file for complete search history.

(56) References Cited

U.S. PATENT DOCUMENTS

| | | | |
|---|---|---|---|
| 6,031,425 A | 2/2000 | Hasegawa | |
| 6,268,751 B1 * | 7/2001 | Chen et al. | 327/175 |
| 8,471,607 B1 * | 6/2013 | Pace | 327/115 |
| 2008/0219399 A1 * | 9/2008 | Nary | 377/47 |

FOREIGN PATENT DOCUMENTS

| | | |
|---|---|---|
| JP | 06-013891 | 1/1994 |
| JP | 11-046136 | 2/1999 |
| JP | 2003-174359 | 6/2003 |
| KR | 1020030055666 | 7/2003 |

\* cited by examiner

*Primary Examiner* — Patrick O'Neill

(74) *Attorney, Agent, or Firm* — Myers Bigel Sibley & Sajovec, P.A.

(57) ABSTRACT

A frequency includes a first edge detection unit configured to generate a first count signal responsive to detecting first edges of an input signal and a second edge detection unit configured to generate a second count signal responsive to detecting the first edges of the input signal in a first operation mode and to generate the second count signal responsive to detecting second edges of the input signal in a second operation mode. One of the first and second edges is a rising edge and the other of the first and second edges is a falling edge. A pulse triggered buffer unit generates an output signal responsive to the first and second count signals. The output signal is divided by a target division ratio with respect to the input signal that is an odd number division ratio in one mode and an even number division ratio in the other mode.

20 Claims, 14 Drawing Sheets

FIG. 7

| VALUE OF DCON or THE NUMBER OF FLIP-FLOP | LOGIC LEVEL OF SEL | DIVISION RATIO |
|---|---|---|
| 1 | H | 1 |
| | L | 2 |
| 2 | H | 3 |
| | L | 4 |
| 3 | H | 5 |
| | L | 6 |
| 4 | H | 7 |
| | L | 8 |
| ⋮ | ⋮ | ⋮ |
| n | H | 2n−1 |
| | L | 2n |

FREQUENCY DIVIDER AND PHASE LOCKED LOOP INCLUDING THE SAME

CROSS-REFERENCE TO RELATED APPLICATION

This application claims priority under 35 USC §119 to Korean Patent Application No. 2011-0063687, filed on Jun. 29, 2011 in the Korean Intellectual Property Office (KIPO), the contents of which are herein incorporated by reference in their entirety.

BACKGROUND

The present inventive concept relates to signal processing, and more particularly to a frequency divider and a phase locked loop (PLL) including the frequency divider.

A frequency divider generates an output signal by dividing an input signal such that a frequency of the output signal is lower than a frequency of the input signal. The frequency divider may be employed in a clock generator, such as a phase locked loop (PLL), or a frequency synthesizer, and various integrated circuits including the clock generator. The frequency divider may be categorized into an odd number frequency divider and an even number frequency divider depending on a division ratio of the frequency divider.

SUMMARY

Some embodiments provide a frequency divider including a first edge detection unit configured to generate a first count signal responsive to detecting first edges of an input signal and a second edge detection unit configured to generate a second count signal responsive to detecting the first edges of the input signal in a first operation mode and to generate the second count signal responsive to detecting second edges, of a different type from the first edges, of the input signal in a second operation mode, wherein one of the first and second edges is a rising edge type and another of the first and second edges is a falling edge type. A pulse triggered buffer unit is configured to generate an output signal responsive to the first count signal and the second count signal. The output signal is divided by a target division ratio with respect to the input signal that is an odd number division ratio in one of the first operation mode or the second operation mode and an even number division ratio in another of the first operation mode or the second operation mode.

In other embodiments, the target division ratio in the first operation mode is the even number division ratio and the target division ratio in the second operation mode is the odd number division ratio. The first edge detection unit and the second edge detection circuit may be further configured to generate their respective count signals responsive to a division control signal to provide a selectable even numbered division ratio in the first operation mode and a selectable odd numbered division ratio in the second operation mode. The frequency divider may further include a mode selection unit coupled to the input signal that is configured to select the first or second operation mode responsive to a selection signal. The mode selection unit may include an inverter that generates an inverted input signal and the mode selection unit may be configured to selectably output the input signal or the inverted input signal to the second edge detection unit responsive to the selection signal. The output signal may have a duty ratio of about 50:50

Further embodiments provide a frequency divider circuit including the frequency divider as described above as a first frequency divider and the output signal of the pulse triggered buffer above as a first output signal. The circuit further includes a second frequency divider configured to generate only an even number division ratio second output signal based on the input signal. An output circuit is configured to selectively provide the second output signal as a selected output signal for the frequency divider circuit when a desired output signal has an even number division ratio of greater than a selection level and to otherwise provide the first output signal as the selected output signal.

According to some example embodiments, a frequency divider includes a first edge detection unit, a second edge detection unit, a pulse triggered buffer unit and a mode selection unit. The first edge detection unit generates a first count signal by detecting first edges of an input signal based on a division control signal. The second edge detection unit generates a second count signal by detecting the first edges of the input signal or second edges of the input signal based on a selection signal and the division control signal. The pulse triggered buffer unit generates an output signal by controlling a logic level of an output node based on the first count signal and the second count signal. The output signal is divided by a target division ratio with respect to the input signal. The mode selection unit sets the target division ratio to an odd number division ratio or an even number division ratio based on the selection signal.

The output signal may have a duty ratio of about 50:50 both when the target division ratio is set to the odd number division ratio and when the target division ratio is set to the even number division ratio.

The target division ratio may be set to the odd number division ratio and the frequency divider operates in a first operation mode when the selection signal has a first logic level. The target division ratio may be set to the even number division ratio and the frequency divider operates in a second operation mode when the selection signal has a second logic level.

The second edge detection unit may generate the second count signal by detecting the second edges of the input signal in the first operation mode. The second edge detection unit may generate the second count signal by detecting the first edges of the input signal in the second operation mode.

The output signal may transition from the second logic level to the first logic level based on the first count signal. The output signal may transition from the first logic level to the second logic level based on the second count signal.

In an example embodiment, the first edge detection unit may include a first shift register and the second edge detection unit may include a second shift register. The first shift register may include a plurality of first flip-flops cascaded connected, and may operate in response to the first edges of the input signal. The second shift register may include a plurality of second flip-flops cascaded connected, may operate in response to the second edges of the input signal in the first operation mode, and may operate in response to the first edges of the input signal in the second operation mode.

Each of the first shift register and the second shift register may include n flip-flops, where n is a natural number equal to or greater than one. The target division ratio may be (2n−1) in the first operation mode and may be 2n in the second operation mode.

In another example embodiment, the first edge detection unit may include a first counter and the second edge detection unit includes a second counter. The first counter may generate the first count signal by counting the first edges of the input signal. The first count signal may be activated when a predetermined number of the first edges of the input signal are counted. The second counter may generate the second count signal by counting the first edges of the input signal or the second edges of the input signal. The second count signal may be activated in the first operation mode when the predetermined number of the second edges of the input signal are counted, and may be activated in the second operation mode when the predetermined number of the first edges of the input signal are counted.

The pulse triggered buffer unit may include a driving signal generation unit, a driving unit and a latch unit. The driving signal generation unit may generate a first driving signal based on the first count signal, and may generate a second driving signal based on the second count signal. The driving unit may change the logic level of the output signal from the second logic level to the first logic level in response to the first driving signal, and may change the logic level of the output signal from the first logic level to the second logic level in response to the second driving signal. The latch unit may maintain the logic level of the output signal.

The driving signal generation unit may include a first delay unit, a second delay unit, a first logic gate and a second logic gate. The first delay unit may generate a first delay signal by delaying the first count signal. The second delay unit may generate a second delay signal by delaying the second count signal. The first logic gate may generate the first driving signal by performing a first logical operation on the first count signal and the first delay signal. The second logic gate may generate the second driving signal by performing a second logical operation on the second count signal and the second delay signal.

The driving unit may include a p-type metal oxide semiconductor (PMOS) transistor and a n-type metal oxide semiconductor (NMOS) transistor. The PMOS transistor may have a first electrode connected to a power supply voltage, a control electrode receiving the first driving signal, and a second electrode connected to the output node. The NMOS transistor may have a first electrode connected to the output node, a control electrode receiving the second driving signal, and a second electrode connected to a ground voltage.

The mode selection unit may include an inverter and a multiplexer. The inverter may generate an inversion signal of the input signal by inverting the input signal. The multiplexer may provide the inversion signal of the input signal to the second edge detection unit based on the selection signal in the first operation mode, and may provide the input signal to the second edge detection unit based on the selection signal in the second operation mode.

The frequency divider may further include a reset signal generation unit. The reset signal generation unit may generate a first reset signal resetting the first count signal and a second reset signal resetting the second count signal based on the output signal. The first reset signal and the second reset signal may be alternately activated.

The reset signal generation unit may include a delay unit and an inverter. The delay unit may generate the second reset signal by delaying the output signal. The inverter may generate the first reset signal by inverting the second reset signal.

According to some example embodiments, a phase locked loop (PLL) includes a phase frequency detector, a charge pump, a loop filter, a voltage controlled oscillator, a first frequency divider and a second frequency divider. The phase frequency detector generates an up signal and a down signal corresponding to a phase difference and a frequency difference between a reference signal and a feedback signal. The charge pump generates a control current based on the up signal and the down signal. The loop filter generates a control voltage by filtering the control current. The voltage controlled oscillator generates an oscillation signal based on the control voltage. The first frequency divider generates the feedback signal by dividing the oscillation signal. The second frequency divider generates an output signal by dividing the oscillation signal. The second frequency divider includes a first edge detection unit, a second edge detection unit, a pulse triggered buffer unit and a mode selection unit. The first edge detection unit generates a first count signal by detecting first edges of the oscillation signal based on a division control signal. The second edge detection unit generates a second count signal by detecting the first edges of the oscillation signal or second edges of the oscillation signal based on a selection signal and the division control signal. The pulse triggered buffer unit generates the output signal by controlling a logic level of an output node based on the first count signal and the second count signal. The output signal is divided by a target division ratio with respect to the oscillation signal. The mode selection unit sets the target division ratio to an odd number division ratio or an even number division ratio based on the selection signal.

Accordingly, the frequency divider according to example embodiments may generate the output signal having the duty ratio of about 50:50 with respect to both the odd number frequency division operation and the even number frequency division operation, without an additional DCC. The division ratio of the frequency divider may be easily and effectively changed based on the selection signal and the division control signal. Thus, the frequency divider may have relatively simple structure and relatively low power consumption.

BRIEF DESCRIPTION OF THE DRAWINGS

Illustrative, non-limiting example embodiments will be more clearly understood from the following detailed description taken in conjunction with the accompanying drawings.

FIG. 7 is a table for describing a target division ratio of the frequency divider of FIG. 2.

DETAILED DESCRIPTION OF THE EMBODIMENTS

Figure 1:
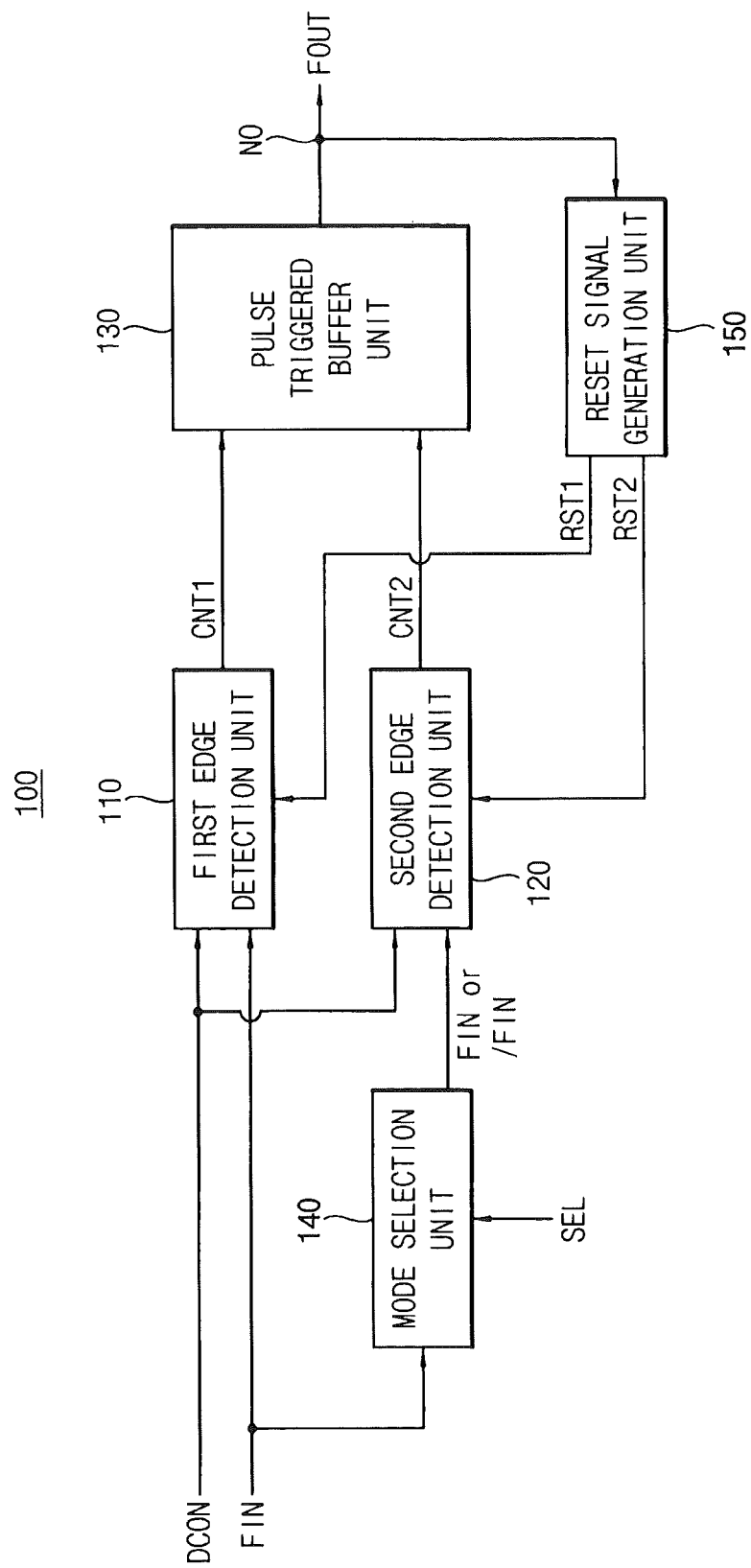
FIG. 1 is a block diagram illustrating a frequency divider according to some example embodiments.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a block diagram illustrating a frequency divider according to some example embodiments. Referring to FIG. 1, a frequency divider 100 includes a first edge detection unit 110, a second edge detection unit 120, a pulse triggered buffer unit 130 and a mode selection unit 140. The frequency divider 100 may further include a reset signal generation unit 150.

The frequency divider 100 according to example embodiments may operate alternately in two modes, that is, a first operation mode and a second operation mode. The first operation mode may be referred to as an odd number frequency division mode and the second operation mode may be referred to as an even number frequency division mode. The operation mode of the frequency divider 100 may be determined based on a selection signal SEL, and a division ratio of the frequency divider 100 may be determined based on the selection signal SEL and a division control signal DCON. The frequency divider 100 may receive the selection signal SEL and the division control signal DCON from an external device, e.g., a controller. Detailed frequency division operations of the frequency divider 100 depending on a logic level of the selection signal and a value of the division control signal DCON will be described below with reference to FIGS. 2 through 7.

The mode selection unit 140 sets a target division ratio to an odd number division ratio or an even number division ratio based on the selection signal SEL. The target division ratio may correspond to a ratio of a frequency of an input signal FIN to a frequency of an output signal FOUT. The mode selection unit 140 may provide one of the input signal FIN and an inversion signal /FIN of the input signal FIN to the second edge detection unit 120 based on the selection signal SEL.

In an example embodiment, the target division ratio may be set to the odd number division ratio and the frequency divider 100 may operate in the first operation mode when the selection signal SEL has a first logic level. The target division ratio may be set to the even number division ratio and the frequency divider 100 may operate in the second operation mode when the selection signal SEL has a second logic level. In other words, the frequency divider 100 may selectively perform an odd number frequency division operation or an even number frequency division operation, based on the selection signal SEL.

The first edge detection unit 110 generates a first count signal CNT1 by detecting first edges of the input signal FIN based on the division control signal DCON. For example, the first edge detection unit 110 may activate the first count signal CNT1 when a predetermined number of the first edges of the input signal FIN are counted. In some embodiments, the predetermined number may be determined based on the division control signal DCON. In other embodiments, the predetermined number may be determined based on the number of flip-flops included in the first edge detection unit 110. The input signal FIN may be generated by a crystal oscillator that uses a crystal material, and may have a fixed frequency.

The second edge detection unit 120 generates a second count signal CNT2 by detecting the first edges of the input signal FIN or second edges of the input signal FIN based on the division control signal DCON and the selection signal SEL. For example, the second edge detection unit 120 may activate the second count signal CNT2 when the predetermined number of the first edges of the input signal FIN are counted or when the predetermined number of the second edges of the input signal FIN are counted, depending on the operation mode of the frequency divider 100. The predetermined number may be determined based on the division control signal DCON or based on the number of flip-flops included in the second edge detection unit 120.

In an example embodiment, the second edge detection unit 120 may generate the second count signal CNT2 by detecting the second edges of the input signal FIN in the first operation mode, and by detecting the first edges of the input signal FIN in the second operation mode. The first edges of the input signal FIN may be rising edges of the input signal FIN, and the second edges of the input signal FIN may be falling edges of the input signal FIN. The first logic level may be a logic high level, and the second logic level may be a logic low level.

The pulse triggered buffer unit 130 generates the output signal FOUT by controlling a logic level of an output node NO based on the first count signal CNT1 and the second count signal CNT2. The output signal FOUT is divided by the target division ratio with respect to the input signal FIN. In an example embodiment, the output signal FOUT may transition from the second logic level to the first logic level based on the first count signal CNT1, and may transition from the first logic level to the second logic level based on the second count signal CNT2. The output signal FOUT may have a duty ratio of about 50:50 both when the target division ratio is set to the odd number division ratio and when the target division ratio is set to the even number division ratio. In other words, the frequency divider 100 may generate the output signal FOUT having the duty ratio of about 50:50 regardless of the operation mode and the target division ratio of the frequency divider 100.

The reset signal generation unit 150 may generate a first reset signal RST1 resetting the first count signal CNT1 and a second reset signal RST2 resetting the second count signal CNT2 based on the output signal FOUT. For example, when the first reset signal RST1 is deactivated, the first count signal CNT1 may be reset. When the second reset signal RST2 is deactivated, the second count signal CNT2 may be reset. The first reset signal RST1 and the second reset signal RST2 may be alternately activated and may be alternately deactivated.

A conventional odd number frequency divider includes an additional duty cycle corrector (DCC) disposed at last stage of the conventional frequency divider to generate an output signal having a duty ratio of about 50:50. A conventional dual mode frequency divider includes a first dividing circuit to perform an odd number frequency division operation and a second dividing circuit to perform an even number frequency division operation. Thus, the conventional frequency divider has relatively complex structure and relatively high power consumption.

The frequency divider 100 according to some example embodiments may independently detect the first edges (e.g., the rising edges) and the second edges (e.g., the falling edges) of the input signal FIN by using the first and second edge detection units 110 and 120, and may generate the output signal FOUT having the duty ratio of about 50:50 with respect to both the odd number frequency division operation and the even number frequency division operation, without an additional DCC. The target division ratio of the frequency divider 100 may be easily and effectively changed from the odd number division ratio to the even number division ratio, or vice versa, based on the selection signal SEL. In other words, the operation mode of the frequency divider 100 may be easily and effectively changed from the first operation mode (e.g., the odd number frequency division mode) to the second operation mode (e.g., the even number frequency division mode), or vice versa, by the selection signal SEL and the mode selection unit 140. In addition, as described below with reference to FIG. 7, the target division ratio of the frequency divider 100 may be easily and effectively changed based on the value of the division control signal DCON. Thus, the frequency divider 100 may have relatively simple structure and relatively low power consumption.

Figure 2:
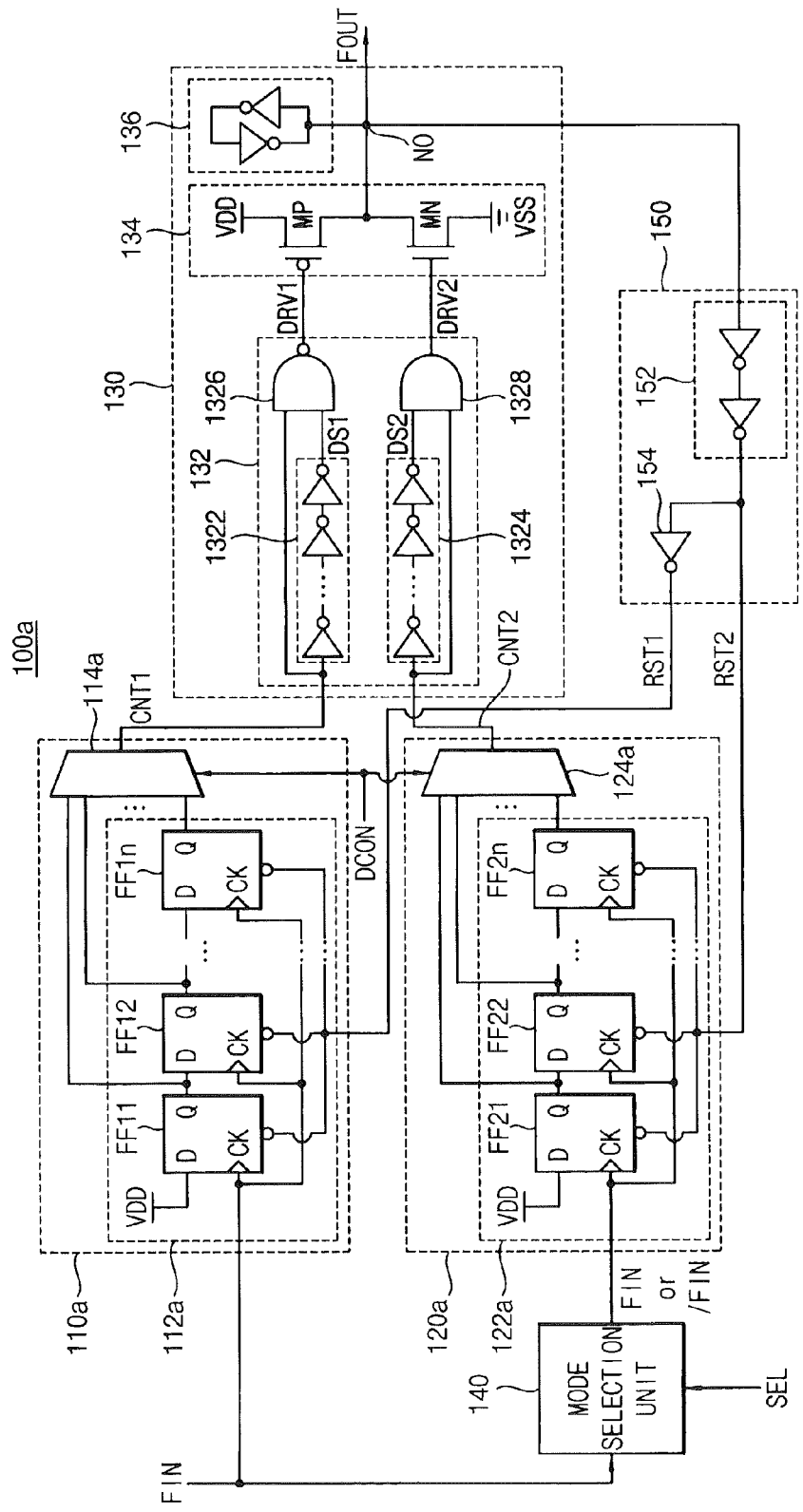
FIG. 2 is a diagram illustrating an example of the frequency divider of FIG. 1.

FIG. 2 is a diagram illustrating an example of the frequency divider of FIG. 1.

Referring to FIG. 2, a frequency divider 100a may include a first edge detection unit 110a, a second edge detection unit 120a, a pulse triggered buffer unit 130, a mode selection unit 140 and a reset signal generation unit 150.

The first edge detection unit 110a may generate the first count signal CNT1 by detecting the first edges of the input signal FIN, and may include a first shift register 112a and a first multiplexer 114a.

The first shift register 112a may include a plurality of first flip-flops FF11, FF12, ..., FF1n, where n is a natural number equal to or greater than one, and may operate in response to the first edges of the input signal FIN. The plurality of first flip-flops FF11, ..., FF1n may be cascaded connected from a first one FF11 of the first flip-flops to a n-th one FF1n of the first flip-flops. For example, an input terminal of the first one FF11 of the first flip-flops may receive initial data having the logic high level (e.g., a power supply voltage VDD), an input terminal of a second one FF12 of the first flip-flops may be connected to an output terminal of the first one FF11 of the first flip-flops, and an input terminal of the n-th one FF1n of the first flip-flops may be connected to an output terminal of a (n−1)-th one of the first flip-flops.

The plurality of first flip-flops FF11, FF12, ..., FF1n may output internal data based on the first edge (e.g., the rising edge) of the input signal FIN. For example, the initial data having the logic high level may be input to the input terminal of the first one FF11 of the first flip-flops, the internal data having the logic high level may be stored in the first one FF11 of the first flip-flops, and the internal data having the logic low level may be stored in the second one FF12 through n-th one FF1n of the first flip-flops. Subsequently, the internal data having the logic high level stored in the first one FF11 of the first flip-flops may be sequentially transferred to the second one FF12 through n-th one FF1n of the first flip-flops in response to the first edges of the input signal FIN. Assuming that n is three, logic levels of the internal data stored in the first one FF11 through third one FF13 of the first flip-flops may be changed in order of, for example, 100, 010, and 001.

The first multiplexer 114a may output one of output signals of the first flip-flops FF11, ..., FF1n as the first count signal CNT1 based on the division control signal DCON. For example, when a value of the division control signal DCON corresponds to one, the first multiplexer 114a may output an output signal of the first one FF11 of the first flip-flops as the first count signal CNT1. When the value of the division control signal DCON corresponds to k, where k is a natural number equal to or greater than one and equal to or less than n, the first multiplexer 114a may output an output signal of a k-th one of the first flip-flops as the first count signal CNT1.

In an example embodiment, the target division ratio of the frequency divider 100a may be determined based on the selection signal SEL and the division control signal DCON. If the value of the division control signal DCON corresponds to k, the target division ratio of the frequency divider 100a may be (2k−1) in the first operation mode (e.g., in the odd number frequency division mode) and may be 2k in the second operation mode (e.g., in the even number frequency division mode). For example, if the value of the division control signal DCON corresponds to three, the target division ratio of the frequency divider 100a may be five in the first operation mode, and may be six in the second operation mode.

The second edge detection unit 120a may generate the second count signal CNT2 by detecting the first edges or the second edges of the input signal FIN depending on the operation mode, and may include a second shift register 122a and a second multiplexer 124a.

The second shift register 122a may include a plurality of second flip-flops FF21, FF22, ..., FF2n, may operate in response to the second edges of the input signal FIN in the first operation mode, and may operate in response to the first edges of the input signal FIN in the second operation mode. The plurality of second flip-flops FF21, ..., FF2n may be cascaded connected from a first one FF21 of the second flip-flops to a n-th one FF2n of the second flip-flops. The second multiplexer 124a may output one of output signals of the second flip-flops FF21, ..., FF2n as the second count signal CNT2 based on the division control signal DCON. The second shift register 122a and the second multiplexer 124a may operate similarly to the first shift register 112a and the first multiplexer 124a, respectively.

According to example embodiment, the first flip-flops FF11, ..., FF1n included in the first shift register 112a and the second flip-flops FF21, ..., FF2n included in the second shift register 122a may be of the same type or may be of different types. For example, if each of the first flip-flops FF11, ..., FF1n is a positive edge triggered type, each of the second flip-flops FF21, ..., FF2n may be the positive edge triggered type or a negative edge triggered type. As described below with reference to FIGS. 3A and 3B, the mode selection unit 140 may be variously implemented depending on types of the flip-flops FF11, ..., FF1n, FF21, ..., FF2n.

The mode selection unit 140 may set the target division ratio to the odd number division ratio or the even number division ratio, and may include a single inverter and a single multiplexer.

Figure 3A:
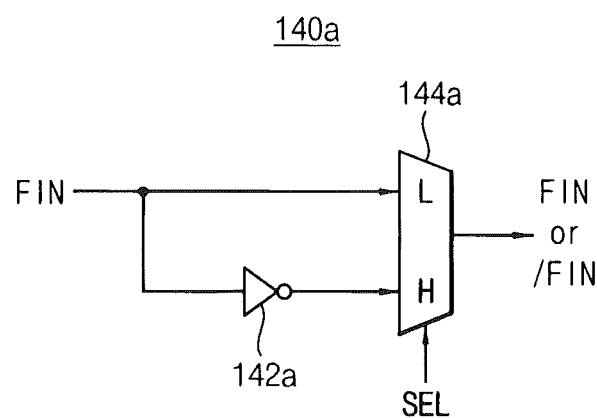
FIGS. 3A and 3B are diagrams illustrating examples of a mode selection unit included in the frequency divider of FIG. 2.
Figure 3B:
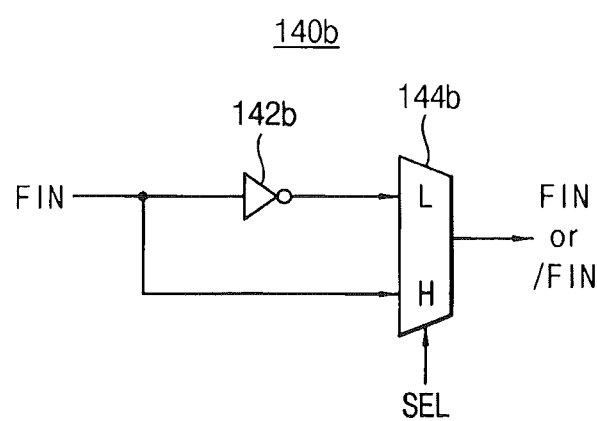

FIGS. 3A and 3B are diagrams illustrating examples of a mode selection unit included in the frequency divider of FIG. 2.

Referring to FIG. 3A, a mode selection unit 140a may include an inverter 142a and a multiplexer 144a.

The inverter 142a may generate the inversion signal /FIN of the input signal FIN by inverting the input signal FIN. The multiplexer 144a may selectively output one of the input signal FIN and the inversion signal /FIN of the input signal FIN based on the selection signal SEL. For example, when the selection signal SEL has the first logic level H (e.g., in the first operation mode), the multiplexer 144a may provide the inversion signal /FIN of the input signal FIN to the second edge detection unit. When the selection signal SEL has the second logic level L (e.g., in the second operation mode), the multiplexer 144a may provide the input signal FIN to the second edge detection unit.

If the mode selection unit 140 in FIG. 2 is implemented with the mode selection unit 140a of FIG. 3A, the first flip-flops FF11, ..., FF1n included in the first shift register 112a and the second flip-flops FF21, ..., FF2n included in the second shift register 122a may be of the same type. For example, the first flip-flops FF11, ..., FF1n and the second flip-flops FF21, ..., FF2n may be the positive edge triggered type. In this embodiment, the first edge detection unit 110a may receive the input signal FIN in the first operation mode, and the second edge detection unit 120a may receive the inversion signal /FIN of the input signal FIN in the first operation mode. Thus, in the first operation mode, the first edge detection unit 110a may operate in response to the first edges (e.g., the rising edges) of the input signal FIN, and the second edge detection unit 120a may operate in response to the second edges (e.g., the falling edges) of the input signal FIN.

Referring to FIG. 3B, a mode selection unit 140b may include an inverter 142b and a multiplexer 144b.

The inverter 142b may generate the inversion signal /FIN of the input signal FIN by inverting the input signal FIN. The multiplexer 144b may selectively output one of the input signal FIN and the inversion signal /FIN of the input signal FIN based on the selection signal SEL. For example, when the selection signal SEL has the first logic level H (e.g., in the first operation mode), the multiplexer 144b may provide the input signal FIN to the second edge detection unit. When the selection signal SEL has the second logic level L (e.g., in the second operation mode), the multiplexer 144b may provide the inversion signal /FIN of the input signal FIN to the second edge detection unit.

If the mode selection unit 140 in FIG. 2 is implemented with the mode selection unit 140b of FIG. 3B, the first flip-flops FF11, ..., FF1n included in the first shift register 112a and the second flip-flops FF21, ..., FF2n included in the second shift register 122a may be of the different types. For example, the first flip-flops FF11, ..., FF1n may be the positive edge triggered type, and the second flip-flops FF21, ..., FF2n may be the negative edge triggered type. In this embodiment, the first edge detection unit 110a and the second edge detection unit 120a may receive the input signal FIN in the first operation mode, respectively. Thus, in the first operation mode, the first edge detection unit 110a may operate in response to the first edges (e.g., the rising edges) of the input signal FIN, and the second edge detection unit 120a may operate in response to the second edges (e.g., the falling edges) of the input signal FIN.

Referring back to FIG. 2, the pulse triggered buffer unit 130 may generate the output signal FOUT based on the first count signal CNT1 and the second count signal CNT2, and may include a driving signal generation unit 132, a driving unit 134 and a latch unit 136.

The driving signal generation unit 132 may generate a first driving signal DRV1 based on the first count signal CNT1, and may generate a second driving signal DRV2 based on the second count signal CNT2. The driving signal generation unit 132 may include a first delay unit 1322, a second delay unit 1324, a first logic gate 1326 and a second logic gate 1328.

The first delay unit 1322 may generate a first delay signal DS1 by delaying the first count signal CNT1. For example, the first delay unit 1322 may include a set of odd-numbered inverters that are cascaded connected, and may delay and invert the first count signal CNT1. The first logic gate 1326 may generate the first driving signal DRV1 by performing a first logical operation on the first count signal CNT1 and the first delay signal DS1. For example, the first logic gate 1326 may be a NAND gate and the first logical operation may be a NAND operation. A logic level of the first driving signal DRV1 may be changed at a point in time at which the first count signal CNT1 is activated, based on the delay operation of the first delay unit 1322.

The second delay unit 1324 may generate a second delay signal DS2 by delaying the second count signal CNT2. For example, the second delay unit 1324 may include a set of odd-numbered inverters that are cascaded connected, and may delay and invert the second count signal CNT2. The second logic gate 1328 may generate the second driving signal DRV2 by performing a second logical operation on the second count signal CNT2 and the second delay signal DS2. For example, the second logic gate 1328 may be an AND gate and the second logical operation may be an AND operation. A logic level of the second driving signal DRV2 may be changed at a point in time at which the second count signal CNT2 is activated, based on the delay operation of the second delay unit 1324. The number of the inverters included in the second delay unit 1324 may be substantially the same as the number of the inverters included in the first delay unit 1322. In other words, a delay time of the second delay unit 1324 may be substantially the same as a delay time of the first delay unit 1322.

The driving unit 134 may change the logic level of the output signal FOUT (e.g., the logic level of the output node NO) from the second logic level to the first logic level in response to the first driving signal DRV1, and may change the logic level of the output signal FOUT from the first logic level to the second logic level in response to the second driving signal DRV2. The driving unit 134 may include a p-type metal oxide semiconductor (PMOS) transistor MP pulling up the logic level of the output node NO to the first logic level and a n-type metal oxide semiconductor (NMOS) transistor MN pulling down the logic level of the output node NO to the second logic level. The PMOS transistor MP may have a first electrode (e.g., source) connected to a power supply voltage VDD, a control electrode (e.g., gate) receiving the first driving signal DRV1, and a second electrode (e.g., drain) connected to the output node NO. The NMOS transistor MN may have a first electrode (e.g., drain) connected to the output node NO, a control electrode (e.g., gate) receiving the second driving signal DRV2, and a second electrode (e.g., source) connected to a ground voltage VSS.

The latch unit 136 may maintain the logic level of the output signal FOUT that are changed by the driving unit 134. The latch unit 136 may include two inverters, where inputs and outputs of the two inverters are cross-coupled.

The reset signal generation unit 150 may generate the first reset signal RST1 and the second reset signal RST2 based on the output signal FOUT, and may include a delay unit 152 and an inverter 154.

The delay unit 152 may generate the second reset signal RST2 by delaying the output signal FOUT. For example, the delay unit 152 may include two inverters that are cascaded connected. The delay unit 152 may provide the second reset signal RST2 to the second flip-flops FF21, . . . , FF2n to reset the second count signal CNT2. The inverter 154 may generate the first reset signal RST1 by inverting the second reset signal RST2. The inverter 154 may provide the first reset signal RST1 to the first flip-flops FF11, . . . , FF1n to reset the first count signal CNT1.

Although FIG. 2 illustrates that the first edge detection unit 110a includes the first shift register 112a and the first multiplexer 114a and the second edge detection unit 120a includes the second shift register 122a and the second multiplexer 124a, the first edge detection unit may be implemented without the first multiplexer 114a and the second edge detection unit may be implemented without the second multiplexer 124a, according to some example embodiments. For example, the first edge detection unit may output the output signal of the last-stage flip-flop (e.g., the n-th one FF1n) of the first flip-flops as the first count signal CNT1, and the second edge detection unit may output the output signal of the last-stage flip-flop (e.g., the n-th one FF2n) of the second flip-flops as the second count signal CNT2. In this embodiment, assuming that the number of flip-flops included in each shift register is n, the target division ratio of the frequency divider may be (2n−1) in the first operation mode (e.g., in the odd number frequency division mode) and may be 2n in the second operation mode (e.g., in the even number frequency division mode).

Figure 4:
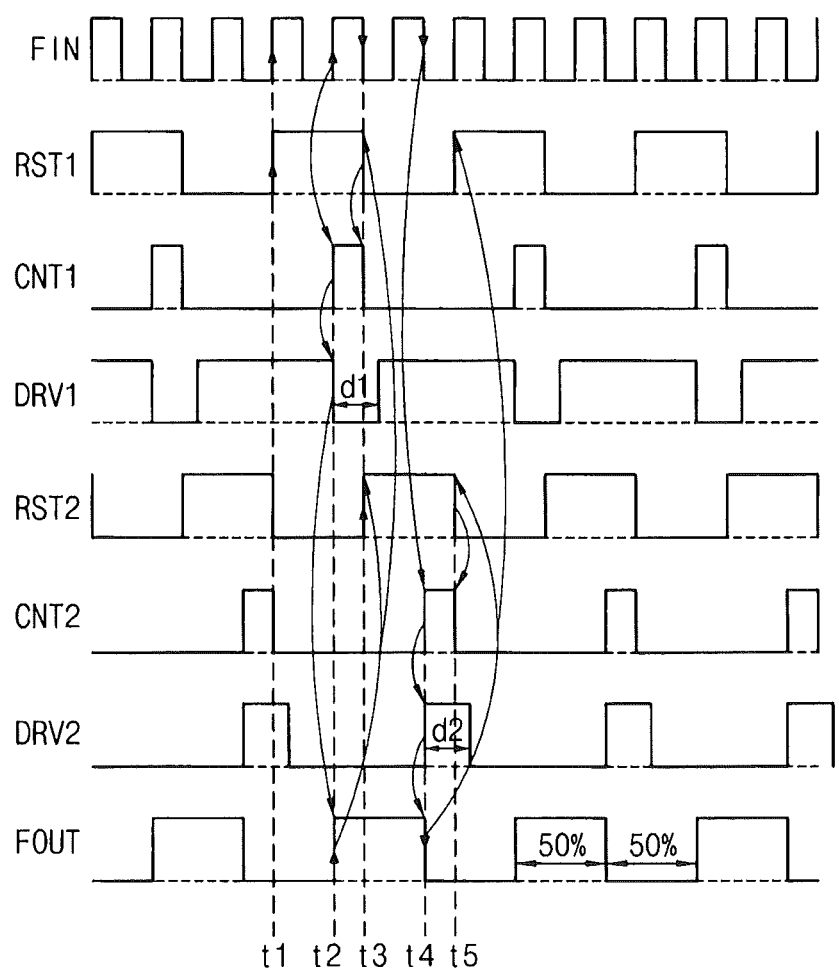
FIGS. 4, 5 and 6 are diagrams for describing an operation of the frequency divider of FIG. 2.
Figure 5:
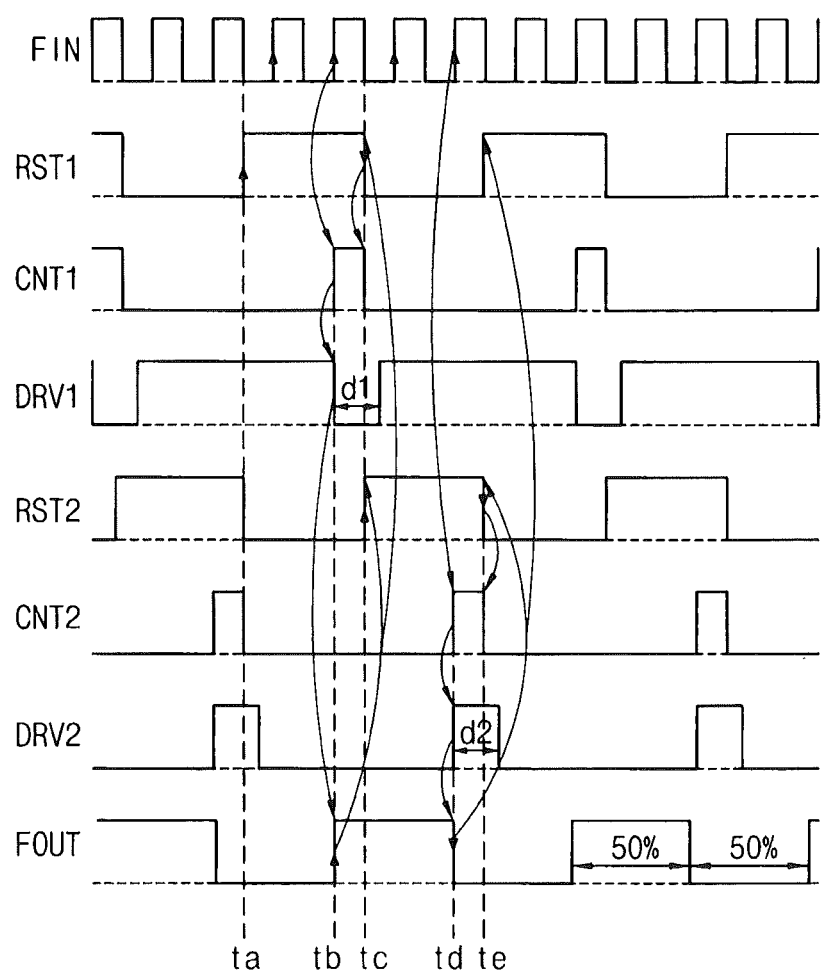
Figure 6:
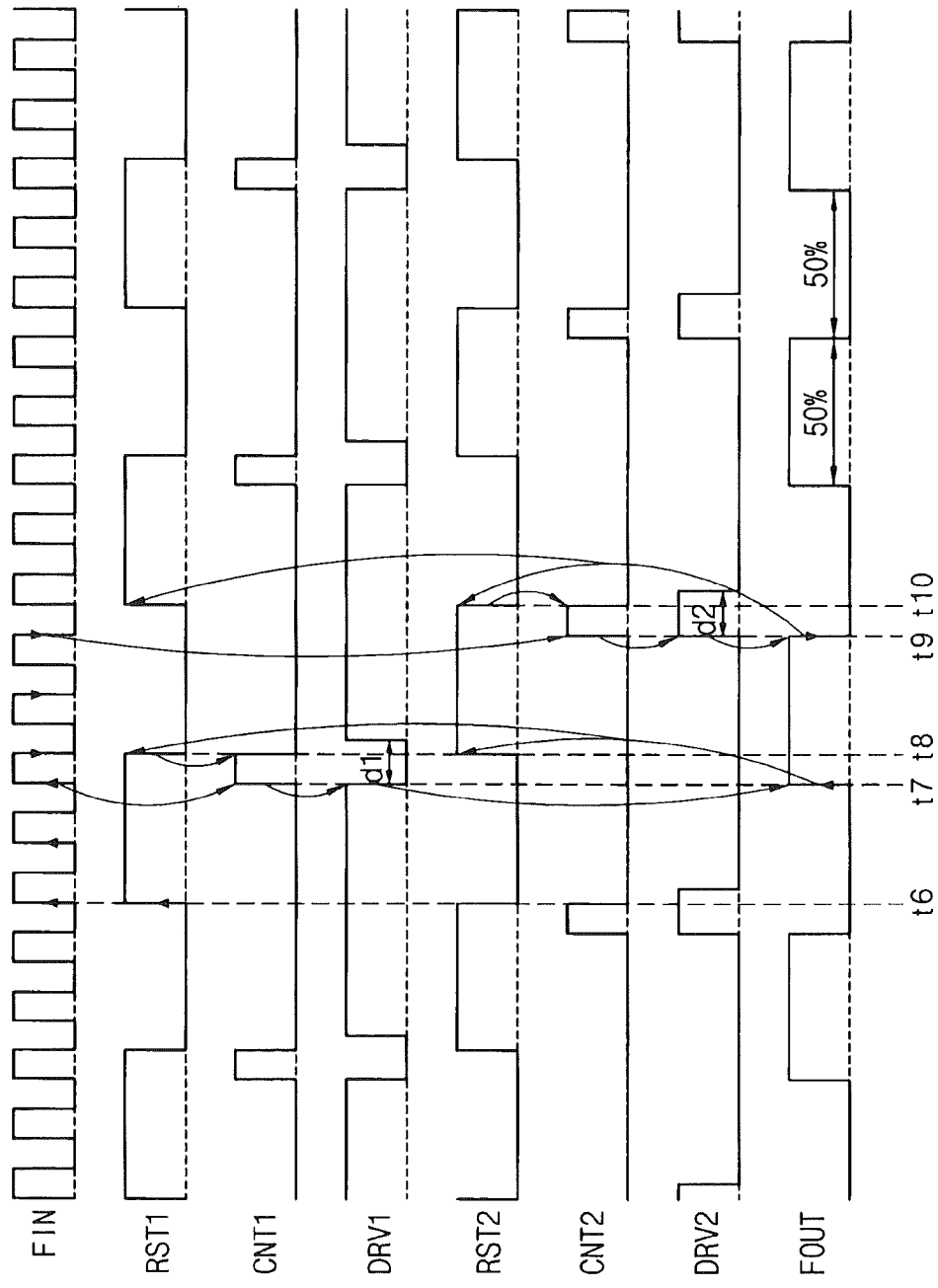

FIGS. 4, 5 and 6 are diagrams for describing an operation of the frequency divider of FIG. 2.

Hereinafter, an example of the operation of the frequency divider 100a will be explained in detail with reference to FIGS. 2, 3A and 4.

In an example of FIG. 4, the frequency divider 100a operates in the odd number frequency division mode, and the target division ratio of the frequency divider 100a is set to three. The first flip-flops FF11, . . . , FF1n and the second flip-flops FF21, . . . , FF2n are of the same type (e.g., the positive edge triggered type), and the selection signal SEL has the logic high level. For example, the value of the division control signal DCON may correspond to two, and the edge detection units 110a and 120a may output the output signals of the second ones FF12 and FF22 of the flip-flops as the count signals CNT1 and CNT2. For another example, if the edge detection units are implemented without the multiplexers 114a and 124a, the edge detection units 110a and 120a may include two flip-flops, respectively, and may output the output signals of the last-stage flip-flops (e.g., the second ones FF12 and FF22) of the flip-flops as the count signals CNT1 and CNT2.

At time t1, the second reset signal RST2 is deactivated by transitioning from the logic high level to the logic low level, and the second edge detection unit 120a and the second count signal CNT2 are reset. The first reset signal RST1 is activated by transitioning from the logic low level to the logic high level, and the first edge detection unit 110a is released from reset state. The first edge detection unit 110a counts the rising edges of the input signal FIN by the predetermined number (e.g., two). The predetermined number may correspond to the value of the division control signal DCON or the number of the flip-flops included in each edge detection unit. The logic levels of the internal data stored in the first one FF11 and second one FF12 of the first flip-flops are changed in order of 10 and 01.

In a time period from time t1 to time t2, two rising edges of the input signal FIN are counted. At time t2, the first count signal CNT1 corresponding to the output signal of the flip-flop FF12 is activated by transitioning from the logic low level to logic high level. Even if the first count signal CNT1 is activated, the first delay signal DS1 is maintained at the logic high level during a first delay time d1 of the first delay unit 1322 because the first delay unit 1322 delays and inverts the first count signal CNT1. Both the first count signal CNT1 and the first delay signal DS1 have the logic high level, and the first driving signal DRV1 transitions from the logic high level to the logic low level. Thus, the PMOS transistor MP included in the driving unit 134 is turned on, the power supply voltage VDD is applied to the output node NO, and the output signal FOUT transitions from the logic low level to the logic high level.

The first driving signal DRV1 transitions from the logic low level to the logic high level and the PMOS transistor MP is turned off after the first delay time d1 is elapsed from time t2. Even if the PMOS transistor MP is turned off, the logic level of the output node NO is maintained at the logic high level by the latch unit 136.

Since the output signal FOUT transitions from the logic low level to the logic high level at time t2 before the time t3, the logic levels of the reset signals RST1 and RST2 are changed at time t3. The first reset signal RST1 is deactivated by transitioning from the logic high level to the logic low level, the first edge detection unit 110a is reset, and the first count signal CNT1 is deactivated. The second reset signal RST2 is activated by transitioning from the logic low level to the logic high level, and the second edge detection unit 120a is released from the reset state. The second edge detection unit 120a counts the falling edges of the input signal FIN by two. The logic levels of the internal data stored in the first one FF21 and second one FF22 of the second flip-flops are changed in order of 10 and 01.

In a time period from time t3 to time t4, two falling edges of the input signal FIN are counted. At time t4, the second count signal CNT2 corresponding to the output signal of the flip-flop FF22 is activated by transitioning from the logic low level to logic high level. Even if the second count signal CNT2 is activated, the second delay signal DS2 is maintained at the logic high level during a second delay time d2 of the second delay unit 1324 because the second delay unit 1324 delays and inverts the second count signal CNT2. Both the second count signal CNT2 and the second delay signal DS2 have the logic high level, and the second driving signal DRV2 transitions from the logic low level to the logic high level. Thus, the NMOS transistor MN included in the driving unit 134 is turned on, the ground voltage VSS is applied to the output node NO, and the output signal FOUT transitions from the logic high level to the logic low level.

The second driving signal DRV2 transitions from the logic high level to the logic low level and the NMOS transistor MN is turned off after the second delay time d2 is elapsed from time t4. Even if the NMOS transistor MN is turned off, the logic level of the output node NO is maintained at the logic low level by the latch unit 136.

Since the output signal FOUT transitions from the logic high level to the logic low level at time t4 before time t5, the logic levels of the reset signals RST1 and RST2 are changed at time t5. The second reset signal RST2 is deactivated by transitioning from the logic high level to the logic low level, the second edge detection unit 120a is reset, and the second count signal CNT2 is deactivated. The first reset signal RST1 is activated by transitioning from the logic low level to the logic high level, and the first edge detection unit 110a is released from the reset state. The first edge detection unit 110a counts the rising edges of the input signal FIN by two.

In the odd number frequency division operation, the frequency divider 100a according to example embodiments may generate the output signal FOUT by repeating such operations from time t1 to time t5. The output signal FOUT may have the logic high level from a falling transition timing (e.g., time t2) of the first driving signal DRV1 to a rising transition timing (e.g., time t4) of the second driving signal DRV2, and may have the logic low level from the rising transition timing (e.g., time t4) of the second driving signal DRV2 to a next falling transition timing of the first driving signal DRV1. Thus, the output signal FOUT may have the duty ratio of about 50:50 with respect to the odd number frequency division operation.

Hereinafter, another example of the operation of the frequency divider 100a will be explained in detail with reference to FIGS. 2, 3A and 5.

In an example of FIG. 5, the frequency divider 100a operates in the even number frequency division mode, and the target division ratio of the frequency divider 100a is set to four. The selection signal SEL has the logic low level. The other operational conditions (e.g., the type of flip-flops, the value of the division control signal DCON, the count signals CNT1 and CNT2, the number of the flip-flops included in each edge detection unit, etc.) of the example of FIG. 5 are substantially the same as the operational conditions of the example of FIG. 4.

At time ta, the second reset signal RST2 is deactivated, and the second edge detection unit 120a and the second count signal CNT2 are reset. The first reset signal RST1 is activated, and the first edge detection unit 110a is released from reset state. The first edge detection unit 110a counts the rising edges of the input signal FIN by the predetermined number (e.g., two).

After two rising edges of the input signal FIN are counted, at time tb, the first count signal CNT1 is activated. Even if the first count signal CNT1 is activated, the first delay signal DS1 is maintained at the logic high level during a first delay time d1 of the first delay unit 1322. Both the first count signal CNT1 and the first delay signal DS1 have the logic high level, and the first driving signal DRV1 transitions from the logic high level to the logic low level. Thus, the PMOS transistor MP is turned on, the power supply voltage VDD is applied to the output node NO, and the output signal FOUT transitions from the logic low level to the logic high level. The logic level of the output node NO is maintained at the logic high level by the latch unit 136.

Since the output signal FOUT transitions from the logic low level to the logic high level at time tb before time tc, the first reset signal RST1 is deactivated, the first edge detection unit 110a is reset, and the first count signal CNT1 is deactivated. The second reset signal RST2 is activated, and the second edge detection unit 120a is released from the reset state. The second edge detection unit 120a counts the rising edges of the input signal FIN by two.

After two rising edges of the input signal FIN are counted, at time td, the second count signal CNT2 is activated. Even if the second count signal CNT2 is activated, the second delay signal DS2 is maintained at the logic high level during a second delay time d2 of the second delay unit 1324. Both the second count signal CNT2 and the second delay signal DS2 have the logic high level, and the second driving signal DRV2 transitions from the logic low level to the logic high level. Thus, the NMOS transistor MN is turned on, the ground voltage VSS is applied to the output node NO, and the output signal FOUT transitions from the logic high level to the logic low level. The logic level of the output node NO is maintained at the logic low level by the latch unit 136.

Since the output signal FOUT transitions from the logic high level to the logic low level at time tb before time te, the second reset signal RST2 is deactivated, the second edge detection unit 120a is reset, and the second count signal CNT2 is deactivated at time te. The first reset signal RST1 is activated, and the first edge detection unit 110a is released from the reset state. The first edge detection unit 110a counts the rising edges of the input signal FIN by two.

In the even number frequency division operation, the frequency divider 100a according to example embodiments may generate the output signal FOUT by repeating such operations from time ta to time te. The output signal FOUT may have the logic high level from a falling transition timing (e.g., time tb) of the first driving signal DRV1 to a rising transition timing (e.g., time td) of the second driving signal DRV2, and may have the logic low level from the rising transition timing (e.g., time td) of the second driving signal DRV2 to a next falling transition timing of the first driving signal DRV1. Thus, the output signal FOUT may have the duty ratio of about 50:50 with respect to the even number frequency division operation.

Hereinafter, still another example of the operation of the frequency divider 100a will be explained in detail with reference to FIGS. 2, 3A and 6.

In an example of FIG. 6, the frequency divider 100a operates in the odd number frequency division mode, and the target division ratio of the frequency divider 100a is set to five. The first flip-flops FF11, . . . , FF1n and the second flip-flops FF21, . . . , FF2n are of the same type (e.g., the positive edge triggered type), and the selection signal SEL has the logic high level. For example, the value of the division control signal DCON may correspond to three, and the edge detection units 110a and 120a may output the output signals of third ones of the flip-flops as the count signals CNT1 and CNT2. For another example, if the edge detection units are implemented without the multiplexers 114a and 124a, the edge detection units 110a and 120a may include three flip-flops, respectively, and may output the output signals of the last-stage flip-flops (e.g., the third ones) of the flip-flops as the count signals CNT1 and CNT2.

At time t6, the second reset signal RST2 is deactivated, and the first reset signal RST1 is activated. The first edge detection unit 110a is released from reset state, and counts the rising edges of the input signal FIN by the predetermined number (e.g., three). The predetermined number may correspond to the value of the division control signal DCON or the number of the flip-flops included in each edge detection unit. After three rising edges of the input signal FIN are counted, at time t7, the first count signal CNT1 is activated, and the first driving signal DRV1 transitions from the logic high level to the logic low level. Thus, the PMOS transistor MP is turned on, and the output signal FOUT transitions from the logic low level to the logic high level. The logic level of the output signal FOUT is maintained at the logic high level by the latch unit 136.

Since the output signal FOUT transitions from the logic low level to the logic high level at time t7 before time t8, the first reset signal RST1 is deactivated, the first edge detection unit 110a is reset, and the first count signal CNT1 is deactivated at time t8. The second reset signal RST2 is activated, and the second edge detection unit 120a is released from the reset state. The second edge detection unit 120a counts the falling edges of the input signal FIN by three. After three falling edges of the input signal FIN are counted, at time t9, the second count signal CNT2 is activated, and the second driving signal DRV2 transitions from the logic low level to the logic high level. Thus, the NMOS transistor MN is turned on, and the output signal FOUT transitions from the logic high level to the logic low level. The logic level of the output signal FOUT is maintained at the logic low level by the latch unit 136.

As the output signal FOUT transitions from the logic high level to the logic low level at time t9 before time t10, at time t10, the second reset signal RST2 is deactivated, the second edge detection unit 120a is reset, and the second count signal CNT2 is deactivated. The first reset signal RST1 is activated, and the first edge detection unit 110a is released from the reset state. The first edge detection unit 110a counts the rising edges of the input signal FIN by three. The frequency divider 100a may generate the output signal FOUT by repeating such operations from time t6 to time t10.

Although FIGS. 4, 5 and 6 illustrate that the first edge detection unit 110a detects the rising edges of the input signal FIN and the second edge detection unit 120a detects the falling edges of the input signal FIN in the odd number frequency division mode and detects the rising edges of the input signal FIN in the even number frequency division mode, the first edge detection unit 110a detects the falling edges of the input signal FIN, and the second edge detection unit 120a detects the rising edges of the input signal FIN in the odd number frequency division mode and detects the falling edges of the input signal FIN in the even number frequency division mode, according to some example embodiments. Although the examples of FIGS. 4, 5 and 6 is explained that the first flip-flops FF11, . . . , FF1n and the second flip-flops FF21, . . . , FF2n are of the same type, the first flip-flops FF11, . . . , FF1n and the second flip-flops FF21, . . . , FF2n are of different types, according to some example embodiments.

FIG. 7 is a table for describing a target division ratio of the frequency divider of FIG. 2.

Referring to FIG. 7, in some embodiments, the target division ratio of the frequency divider 100a may be determined based on the selection signal SEL and the division control signal DCON. The target division ratio may be determined as one of the odd number division ratio and the even number division ratio based on the logic level of the selection signal SEL. A magnitude of the target division ratio may be determined based on the value of the division control signal DCON. For example, if the value of the division control signal DCON corresponds to n, the target division ratio may be (2n−1) in the odd number frequency division mode (e.g., when the selection signal has the logic high level H) and may be 2n in the even number frequency division mode (e.g., when the selection signal has the logic low level L). Thus, the target division ratio of the frequency divider 100a may be easily and effectively changed based on the selection signal SEL and the division control signal DCON.

In other embodiments, if the edge detection units are implemented without the multiplexers 114a and 124a, the target division ratio of the frequency divider 100a may be determined based on the selection signal SEL and the number of the flip-flops included in each edge detection unit. For example, if each edge detection unit includes n flip-flops, the target division ratio may be (2n−1) in the odd number frequency division mode and may be 2n in the even number frequency division mode.

Figure 8:
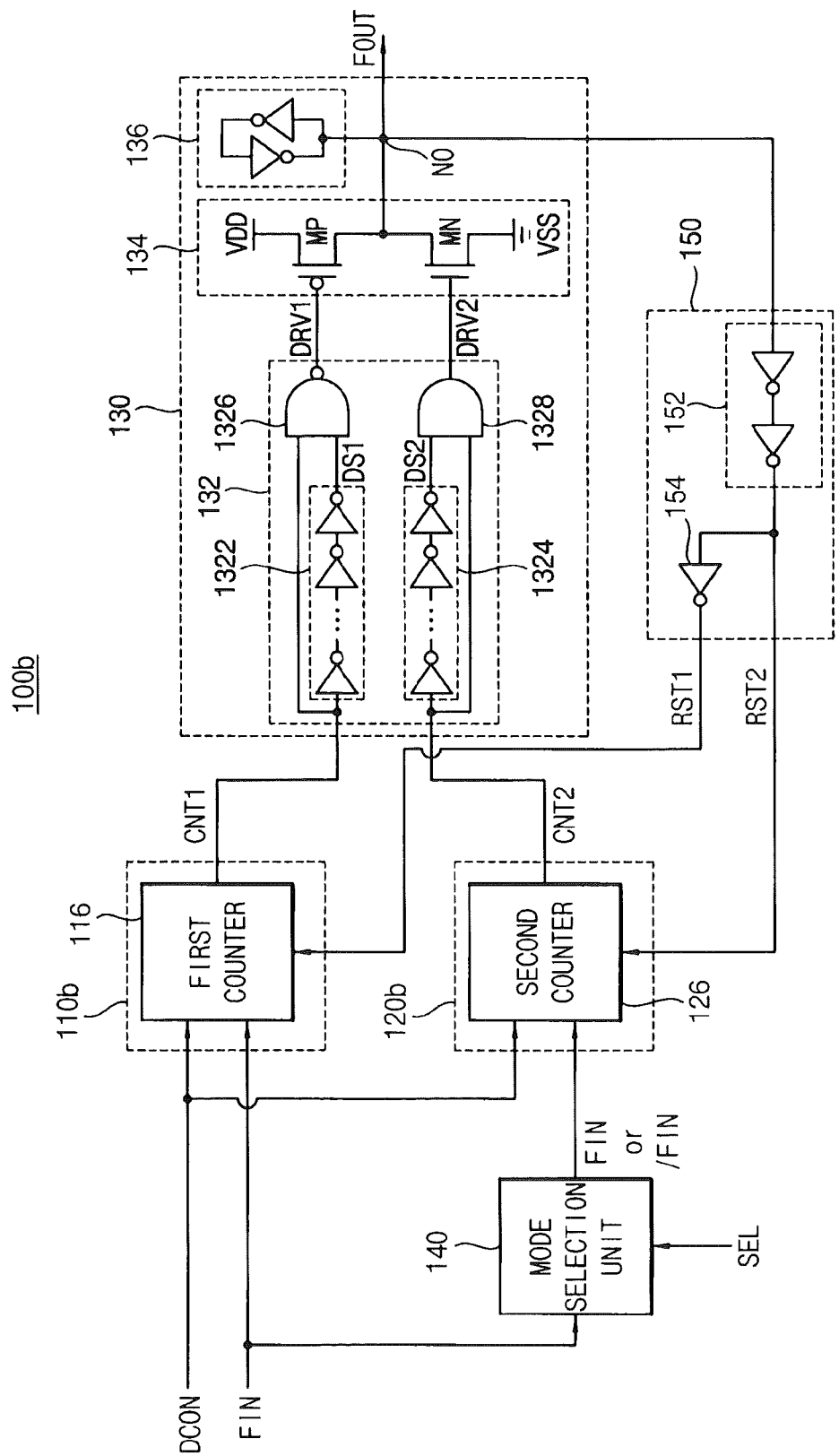
FIG. 8 is a diagram illustrating another example of the frequency divider of FIG. 1.

FIG. 8 is a diagram illustrating another example of the frequency divider of FIG. 1.

Referring to FIG. 8, a frequency divider 100b may include a first edge detection unit 110b, a second edge detection unit 120b, a pulse triggered buffer unit 130, a mode selection unit 140 and a reset signal generation unit 150. The pulse triggered buffer unit 130, the mode selection unit 140 and the reset signal generation unit 150 may be substantially the same as the pulse triggered buffer unit 130, the mode selection unit 140 and the reset signal generation unit 150 in FIG. 2, respectively.

The first edge detection unit 110b may include a first counter 116 that generates the first count signal CNT1 by counting the first edges of the input signal FIN based on the division control signal DCON. The first count signal CNT1 may be activated when a predetermined number of the first edges of the input signal FIN are counted.

The second edge detection unit 120b may include a second counter 126 that generates the second count signal CNT2 by counting the first edges of the input signal FIN or the second edges of the input signal FIN based on the division control signal DCON. The second count signal may be activated in the first operation mode when the predetermined number of the second edges of the input signal FIN are counted, and may be activated in the second operation mode when the predetermined number of the first edges of the input signal FIN are counted. Each of the counters 116 and 126 may be implemented with a synchronous counter, and/or may be implemented with a n-bit binary counter, according to example embodiments.

In an example embodiment, an initial value of the first counter 116 may be set based on the division control signal DCON, and the first count signal CNT1 may correspond to a most significant bit (MSB) of a first count value of the first counter 116. For example, if the first counter 116 is a normal 3-bit binary counter, the initial value of the first counter 116 may be set to 001 based on the division control signal DCON such that the first counter 116 operates as illustrated in FIG. 6. In this embodiment, the first count value may be changed in order of, for example, 010, 011, and 100. For another example, if the first counter 116 is a 3-bit ring counter or a 3-bit Johnson counter, the initial value of the first counter 116 may be set to 000 based on the division control signal DCON such that the first counter 116 operates as illustrated in FIG. 6. In this embodiment, the first count value may be changed in order of, for example, 001, 010, and 100 in the 3-bit ring counter, or may be changed in order of, for example, 001, 011, and 111 in the 3-bit Johnson counter. The first count signal CNT1 corresponding to the MSB of the first count value may be activated after three rising edges of the input signal FIN are counted. Similarly, an initial value of the second counter 126 may be set based on the division control signal DCON, and the second count signal CNT2 may correspond to a MSB of a second count value of the second counter 126.

In another example embodiment, the first counter 116 may output one bit of the first count value of the first counter 116 as the first count signal CNT1 based on the division control signal DCON. For example, if the first counter 116 is a 3-bit ring counter or a 3-bit Johnson counter and the initial value of the first counter 116 is fixed to 000, the first count value may be changed in order of, for example, 001, 010, and 100 in the 3-bit ring counter, or may be changed in order of, for example, 001, 011, and 111 in the 3-bit Johnson counter. When the value of the division control signal DCON corresponds to two, the first counter 116 may output a second bit of the first count value as the first count signal CNT1 such that the first counter 116 operates as illustrated in FIGS. 4 and 5. When the value of the division control signal DCON corresponds to three, the first counter 116 may output a first bit (e.g., a MSB) of the first count value as the first count signal CNT1 such that the first counter 116 operates as illustrated in FIG. 6. Similarly, the second counter 126 may output one bit of the second count value of the second counter 126 as the second count signal CNT2 based on the division control signal DCON.

Figure 9:
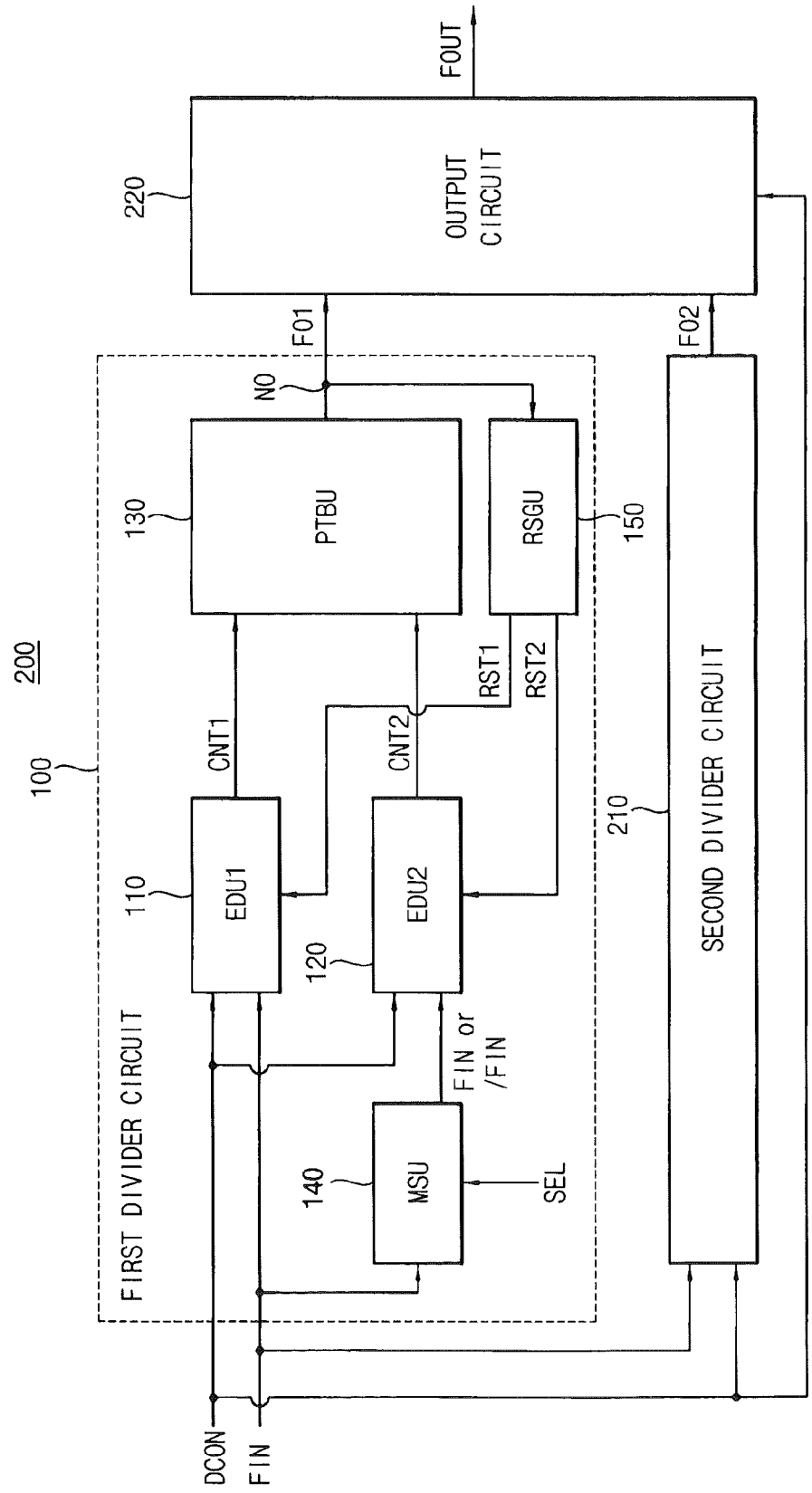
FIG. 9 is a block diagram illustrating a frequency divider according to other example embodiments.

FIG. 9 is a block diagram illustrating a frequency divider according to other example embodiments.

Referring to FIG. 9, a frequency divider 200 includes a first divider circuit 100, a second divider circuit 210 and an output circuit 220.

The first divider circuit 100 generates a first frequency-divided signal FO1 by dividing an input signal FIN based on a division control signal DCON. The first divider circuit 100 may be implemented with a dual mode frequency divider that selectively performs an odd number frequency division operation or an even number frequency division operation. The first divider circuit 100 may be substantially the same as the frequency divider 100 of FIG. 1. A target division ratio of the first divider circuit 100 may be easily and effectively changed based on a selection signal SEL and the division control signal DCON.

The second divider circuit 210 generates a second frequency-divided signal FO2 by dividing the input signal FIN based on the division control signal DCON. The second divider circuit 210 may be implemented with a divide-by-$2^m$ frequency divider that performs only the even number frequency division operation, where m is a natural number equal to or greater than one. The divide-by-$2^m$ frequency divider may include m divide-by-2 frequency dividers that are cascaded connected.

The output circuit 220 outputs the first frequency-divided signal FO1 or the second frequency-divided signal FO2 as an output signal FOUT based on the division control signal DCON.

In an example embodiment, a division ratio of the frequency divider 200 may be determined based on the division control signal DCON, and the frequency divider 200 may generate the output signal FOUT by using one of the first divider circuit 100 and the second divider circuit 210 depending on the division ratio. For example, when the division ratio of the frequency divider 200 may be $2^m$ (e.g., when the division control signal DCON corresponds to $2^m$), the second divider circuit 210 may generate the second frequency-divided signal FO2 by dividing the input signal FIN by $2^m$, and the output circuit 220 may output the second frequency-divided signal FO2 as the output signal FOUT. When the division ratio of the frequency divider 200 may be x (e.g., when the division control signal DCON corresponds to x), where x is a natural number equal to or greater than one and not to $2^m$, the first divider circuit 100 may generate the first frequency-divided signal FO1 by dividing the input signal FIN by x, and the output circuit 220 may output the first frequency-divided signal FO1 as the output signal FOUT. For another example, when the division ratio of the frequency divider 200 is relatively small, the frequency divider 200 may generate the output signal FOUT by using the first divider circuit 100. When the division ratio of the frequency divider 200 is relatively large, the frequency divider 200 may generate the output signal FOUT by using the second divider circuit 210.

The frequency divider 100 of FIG. 1 may have limited dynamic ranges depending on a frequency of the input signal FIN, because of delays of the flip-flops (e.g., the flip-flops FF11, ..., FF1n, FF21, ..., FF2n in FIG. 2) included in the edge detection units 110 and 120. The delay of each flip-flop, e.g., a C-to-Q delay, indicates a time interval from a timing point when an input signal is received to a timing point when an output signal is provided. For proper operation of the frequency divider 100 in the odd number frequency division mode, the frequency divider 100 should operate with the following Equation 1 being satisfied:

$$N*dt<1/(2*fin) \qquad \text{[Equation 1]}$$

In addition, for proper operation of the frequency divider 100 in the even number frequency division mode, the frequency divider 100 should operate with the following Equation 2 being satisfied:

$$N*dt<1/fin \qquad \text{[Equation 2]}$$

In Equations 1 and 2, N represents the number of the flip-flops included in each edge detection unit, dt represents the delay of a single flip-flop, and fin represents the frequency of the input signal FIN. Each edge detection unit may include various number of the flip-flips with such Equations 1 and 2 being satisfied, and the frequency divider 100 may have various division ratios depending on the number of the flip-flops included in each edge detection unit. However, if each edge detection unit includes excessively large number of flip-flips, size and power consumption of the frequency divider 100 may be significantly increased.

The frequency divider 200 according to other example embodiments may include the first divider circuit 100 that is substantially the same as the frequency divider 100 of FIG. 1 and the second divider circuit 210 that is implemented with a divide-by-$2^m$ frequency divider. When the division ratio of the frequency divider 200 is relatively large or $2^m$, the frequency divider 200 may generate the output signal FOUT by using the second divider circuit 210. When the division ratio of the frequency divider 200 is relatively small or an integer that is not to $2^m$, the frequency divider 200 may generate the output signal FOUT by using the first divider circuit 100. Thus, the frequency divider 200 may have relatively simple structure and relatively low power consumption with relatively high division ratio.

Figure 10:
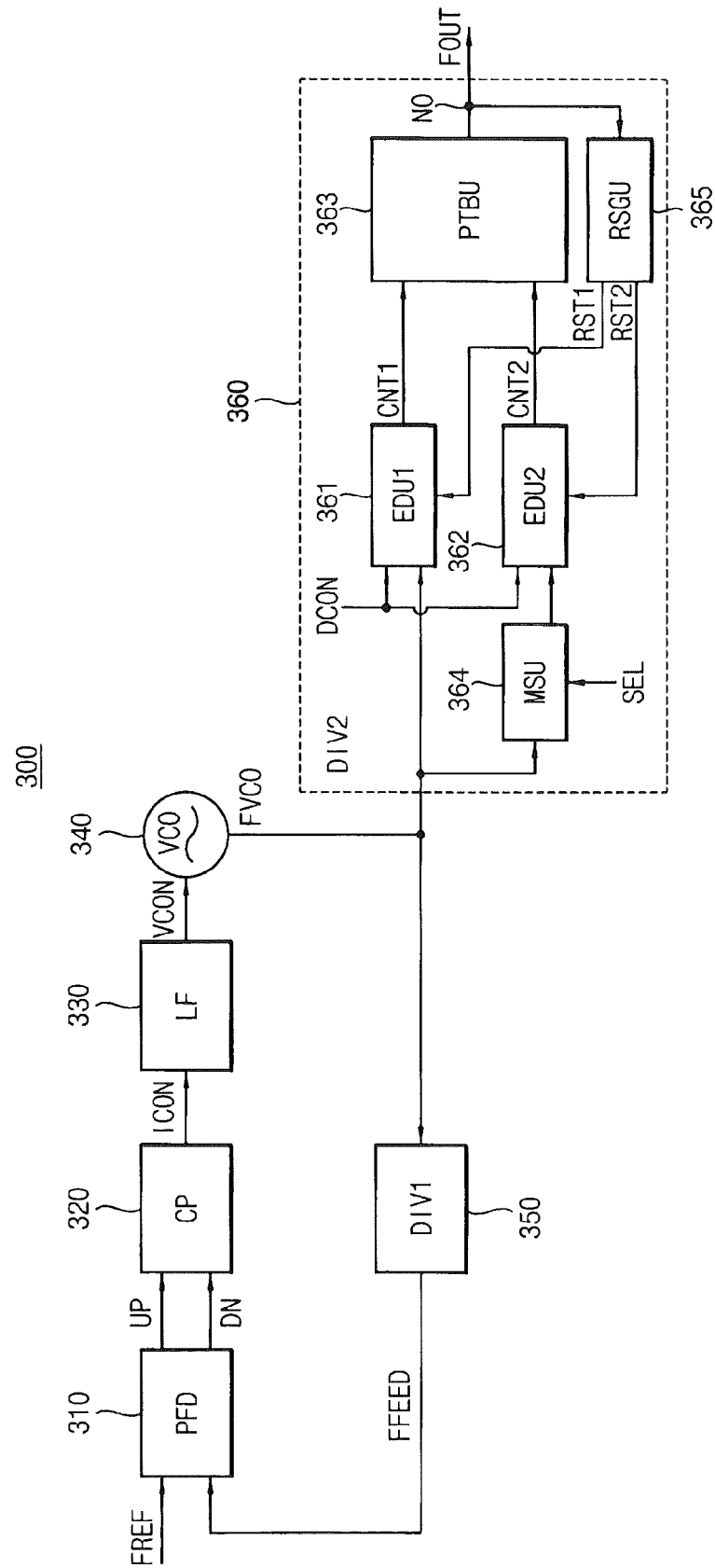
FIG. 10 is a block diagram illustrating a phase locked loop according to example embodiments.

FIG. 10 is a block diagram illustrating a phase locked loop according to example embodiments.

Referring to FIG. 10, a phase locked loop (PLL) 300 includes a phase frequency detector (PFD) 310, a charge pump (CP) 320, a loop filter (LF) 330, a voltage controlled oscillator (VCO) 340, a first frequency divider 350 and a second frequency divider 360.

The PFD 310 generates an up signal UP and a down signal DN corresponding to a phase difference and a frequency difference between a reference signal FREF and a feedback signal FFEED. For example, the up signal UP may be activated when a phase of the reference signal FREF leads a phase of the feedback signal FFEED, and the down signal DN may be activated when the phase of the reference signal FREF lags the phase of the feedback signal FFEED. According to example embodiments, the reference signal FREF may be a wired or wireless signal received from an external circuit or device, or may be an oscillation signal generated by an oscillator located inside or outside the PLL 300. For example, the reference signal FREF may be the oscillation signal generated by a crystal oscillator.

The CP 320 generates a control current ICON based on the up signal UP and the down signal DN. The LF 330 generates a control voltage VCON by filtering the control current ICON, and maintains the control voltage VCON at a constant voltage level. For example, the CP 320 and the LF 330 may increase a level of the control voltage VCON in response to the up signal UP, and may decrease the level of the control voltage VCON in response to the down signal DN. The LF 330 may be a low pass filter.

The VCO 340 generates an oscillation signal FVCO based on the control voltage VCON. For example, the VCO 340 may increase or decrease the frequency of the oscillation signal FVCO in response to the control voltage VCON.

The first frequency divider 350 generates the feedback signal FFEED by dividing the oscillation signal FVCO. In some example embodiments, the PLL 300 may be implemented without the first frequency divider 350. In this case, the PFD 310 may receive the oscillation signal FVCO as the feedback signal FFEED.

The second frequency divider 360 generates an output signal FOUT by dividing the oscillation signal FVCO. The second frequency divider 360 may be substantially the same as the frequency divider 100 of FIG. 1. The second frequency divider 360 may include a first edge detection unit 361, a second edge detection unit 362, a pulse triggered buffer unit 363, a mode selection unit 364 and a reset signal generation unit 365. The second frequency divider 360 may independently detect the first edges (e.g., the rising edges) and the second edges (e.g., the falling edges) of the oscillation signal FVCO by using the first and second edge detection units 361 and 362 to generate the output signal FOUT. According to example embodiments, the second frequency divider 360 may be implemented with the frequency divider 100a of FIG. 2, the frequency divider 100b of FIG. 8, and the frequency divider 200 of FIG. 9.

Figure 11:
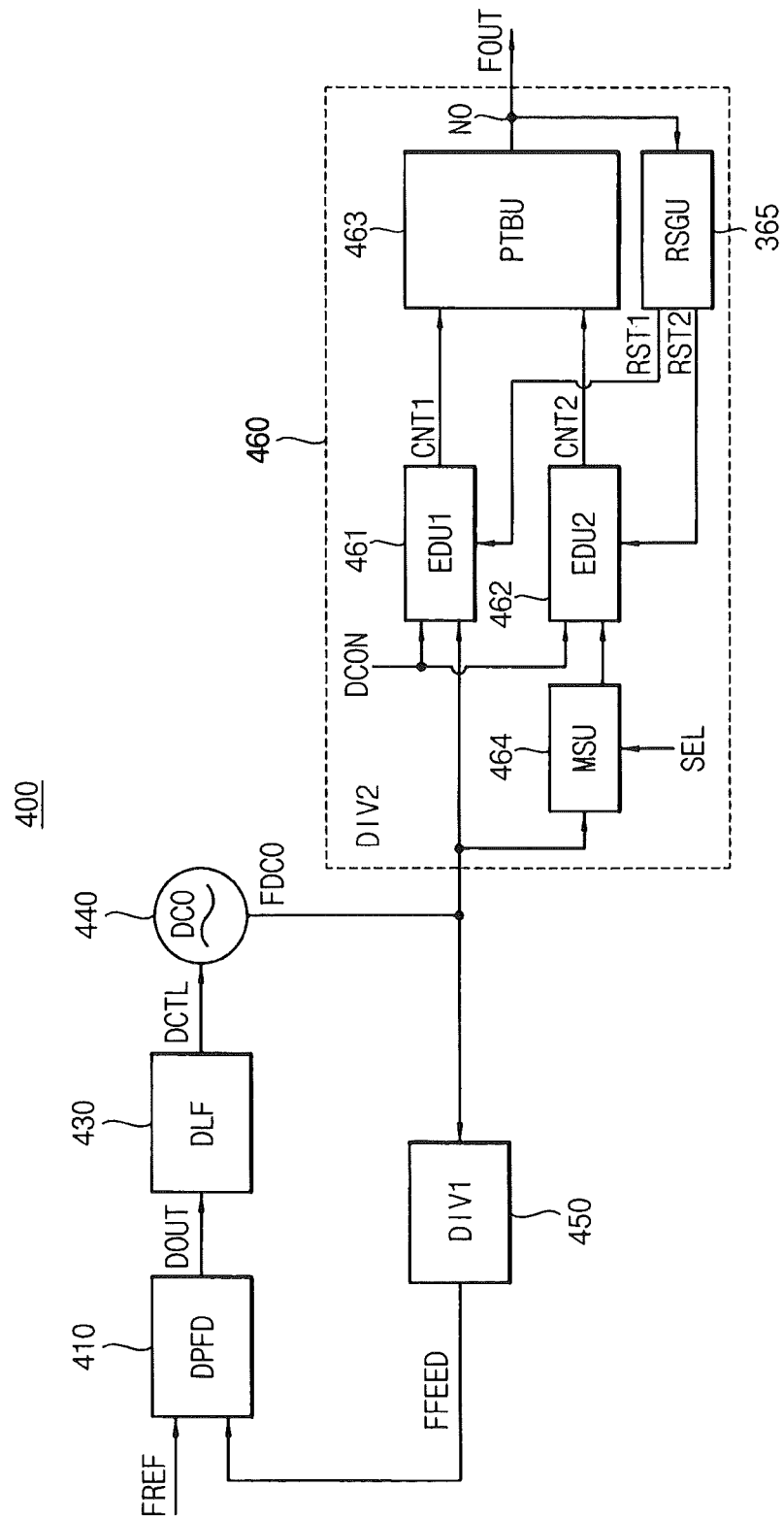
FIG. 11 is a block diagram illustrating a digital phase locked loop according to example embodiments.

FIG. 11 is a block diagram illustrating a digital phase locked loop according to example embodiments.

Referring to FIG. 11, a digital phase locked loop (DPLL) 400 includes a digital phase frequency detector (DPFD) 410, a digital loop filter (DLF) 430, a digitally controlled oscillator (DCO) 440, a first frequency divider 450 and a second frequency divider 460.

The DPFD 410 generates a digital phase frequency difference signal DOUT corresponding to a phase difference and a frequency difference between a reference signal FREF and a feedback signal FFEED. The DLF 430 generates a digital control signal DCTL by filtering the digital phase frequency difference signal DOUT. The DLF 430 may be implemented as a low pass filter. For example, the DLF 430 may have a transfer function of "$\alpha+\beta*z-1/(1-z-1)$".

The DCO 440 generates an oscillation signal FDCO having a desired frequency in response to the digital control signal DCTL. For example, the DCO 440 may increase or decrease the frequency of the oscillation signal FDCO in response to the digital control signal DCTL. The first frequency divider 450 generates the feedback signal FFEED by dividing the oscillation signal FDCO. In some example embodiments, the DPLL 400 may be implemented without the first frequency divider 450. In this case, the DPFD 410 may receive the oscillation signal FDCO as the feedback signal FFEED.

The second frequency divider 460 generates an output signal FOUT by dividing the oscillation signal FDCO. The second frequency divider 460 may be substantially the same as the frequency divider 100 of FIG. 1. The second frequency divider 460 may include a first edge detection unit 461, a second edge detection unit 462, a pulse triggered buffer unit 463, a mode selection unit 464 and a reset signal generation unit 465. The second frequency divider 460 may independently detect the first edges (e.g., the rising edges) and the second edges (e.g., the falling edges) of the oscillation signal FDCO by using the first and second edge detection units 461 and 462 to generate the output signal FOUT.

The PLL 300 of FIG. 10 and the DPLL 400 of FIG. 11 may include the second frequency dividers 360 and 460 that generate the output signal FOUT having the duty ratio of about 50:50 with respect to both the odd number frequency division operation and the even number frequency division operation, without an additional DCC. The target division ratio of the second frequency dividers 360 and 460 may be easily and effectively changed. Thus, the PLL 300 and the DPLL 400 according to example embodiments may have relatively improved operational performance, relatively simple structure and relatively low power consumption. The PLL 300 and the DPLL 400 may be employed in various electronic circuits requiring relatively high speed operation, such as a Double Data Rate (DDR) memory, an Advanced Risc Machine (ARM) processor, a Serializer/Deserializer (SERDES), etc.

Although not illustrated in FIGS. 10 and 11, the first frequency dividers 350 and 450 may be substantially the same as the frequency divider 100 of FIG. 1. In addition, the PLL 300 of FIG. 10 and the DPLL 400 of FIG. 11 may further include third frequency dividers (not illustrated) that generate the reference signal FREF by dividing an input signal. The third frequency dividers may be substantially the same as the frequency divider 100 of FIG. 1.

Figure 12:
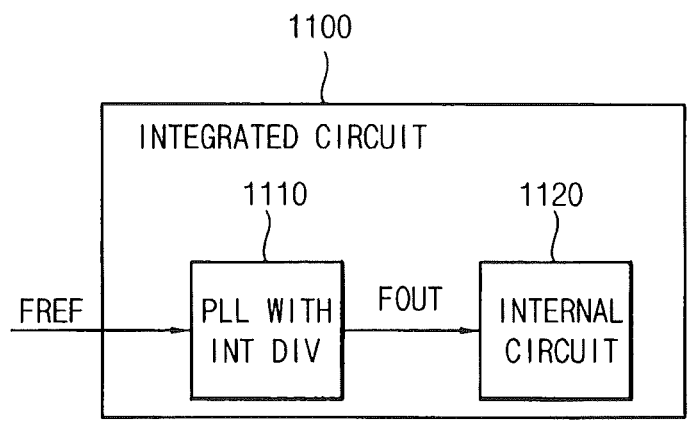
FIG. 12 is a block diagram illustrating an integrated circuit including a phase locked loop according to example embodiments.

FIG. 12 is a block diagram illustrating an integrated circuit including a phase locked loop according to example embodiments.

Referring to FIG. 12, an integrated circuit 1100 includes a PLL 1110 and an internal circuit 1120. According to example embodiments, the integrated circuit 1100 may be an application processor (AP), a microprocessor, a central processing unit (CPU), an application-specific integrated circuit (ASIC), a mobile system-on-chip (SOC), a multimedia SOC, a smart card, or the like.

The PLL 1110 may generate an output signal FOUT having a desired frequency or phase based on a reference signal FREF. According to example embodiments, the reference signal FREF may be a wired or wireless signal received from an external circuit or device, or may be an oscillation signal generated by an oscillator located inside or outside the PLL 1110. The PLL 1110 may be one of the PLL 300 of FIG. 10 and the DLPP 400 of FIG. 11. The PLL 1110 may generate the output signal FOUT having the duty ratio of about 50:50 with respect to both the odd number frequency division operation and the even number frequency division operation, without an additional DCC, and thus may have relatively improved operational performance, relatively simple structure and relatively low power consumption.

The internal circuit 1120 may operate based on the output signal FOUT. For example, the internal circuit 1120 may use the output signal FOUT as a clock signal for operating the internal circuit 1120.

Figure 13:
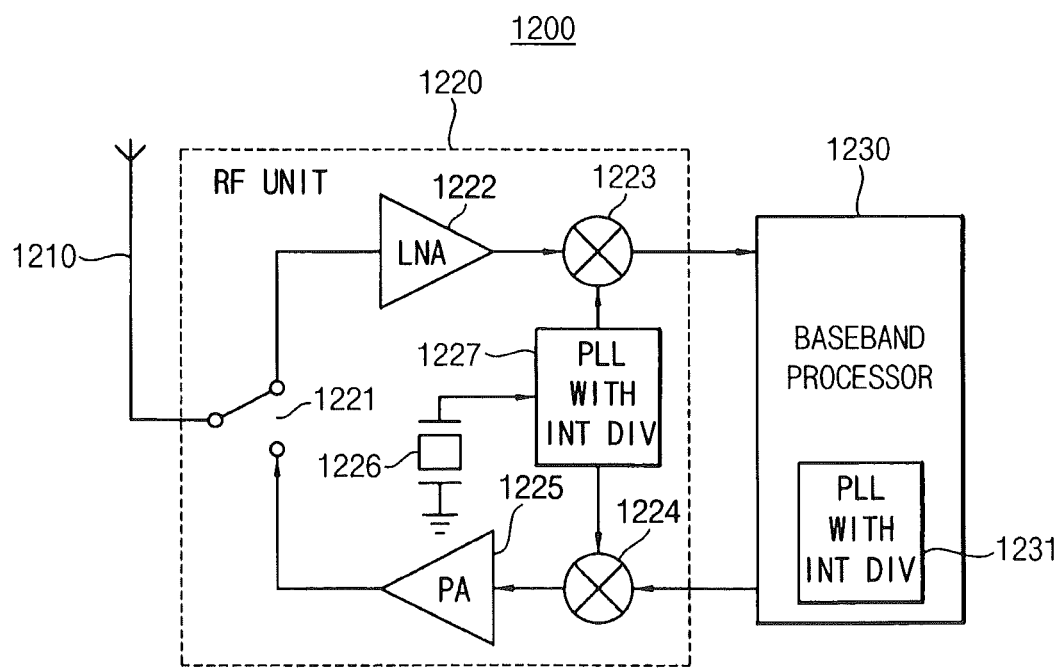
FIG. 13 is a block diagram illustrating a transceiver including a phase locked loop according to example embodiments.

FIG. 13 is a block diagram illustrating a transceiver including a phase locked loop according to example embodiments.

Referring to FIG. 13, a transceiver 1200 includes an antenna 1210, a radio frequency (RF) unit 1220 and a baseband processor 1230.

The RF unit 1220 may convert a wireless signal received through the antenna 1210 into a baseband signal to provide the baseband processor 1230 with the baseband signal, and may convert a baseband signal provided from the baseband processor 1230 into a wireless signal to transmit the wireless signal through the antenna 1210. In some example embodiments, the RF unit 1220 may directly convert the received wireless signal into the baseband signal. In other example embodiments, the RF unit 1220 may first convert the received wireless signal into an intermediate frequency (IF) signal, and then may convert the IF signal into the baseband signal. In some example embodiments, the RF unit 1220 may convert the received wireless signal into an in-phase baseband signal and a quadrature baseband signal.

For example, the RF unit 1220 may include a switch 1221, a low noise amplifier (LNA) 1222, a reception mixer 1223, a transmission mixer 1224, a power amplifier (PA) 1225, a local oscillator (LO) 1226 and a first PLL 1227. In some example embodiments, the RF unit 1220 may further include a filter for removing a noise or an out-of-band component of the received wireless signal or for removing an out-of-band spurious component of the wireless signal to be transmitted. According to example embodiments, the RF unit 1220 may further include a variable gain amplifier, a low pass filter, etc.

The switch 1221 may selectively couple the antenna 1210 to a reception path or a transmission path. The LNA 1222 may have a low noise figure to reduce an influence of a noise, and may amplify the wireless signal received through the antenna 1210. The reception mixer 1223 may down-convert the wireless signal amplified by the LNA 1222 into the baseband signal by mixing the wireless signal with an output signal of the first PLL 1227. The transmission mixer 1224 may up-convert a baseband signal provided from the baseband processor 1230 into a wireless signal by mixing the baseband signal with the output signal of the first PLL 1227. The PA 1225 may amplify the wireless signal that is up-converted by the transmission mixer 1224 such that a wireless signal transmitted through the antenna 1210 has a power greater than a predetermined power.

The LO 1226 may generate an oscillation signal. For example, the LO 1226 may include a crystal oscillator. The first PLL 1227 may generate an output signal having a desired frequency based on the oscillation signal provided from the LO 1226. The first PLL 1227 may generate the output signal having the duty ratio of about 50:50 with respect to both the odd number frequency division operation and the even number frequency division operation, without an additional DCC, and thus may have relatively improved operational performance, relatively simple structure and relatively low power consumption.

The baseband processor 1230 may perform data processing based on the baseband signal received from the RF unit 1220, and may generate a baseband signal to be transmitted to provide the RF unit 1220 with the baseband signal to be transmitted. For example, the baseband processor 1230 may include a physical layer processor (PHY) for generating a data stream by demodulating a baseband signal received from the RF unit 1220 and for generating the baseband signal to be provided to the RF unit 1220 by modulating a data steam. According to example embodiments, the PHY may include a fast Fourier transformer (FFT), a demapper, a deinterleaver, a channel decoder, etc. to demodulate the baseband signal, and may include a channel encoder, an interleaver, a mapper, an inverse fast Fourier transformer (IFFT), etc. to modulate the data stream.

The baseband processor 1230 may include a second PLL 1231. For example, the baseband processor 1230 may use an output signal of the second PLL 1231 as a clock signal for operating the baseband processor 1230. The second PLL 1231 may generate the output signal having the duty ratio of about 50:50 with respect to both the odd number frequency division operation and the even number frequency division operation, without an additional DCC, and thus may have relatively improved operational performance, relatively simple structure and relatively low power consumption.

Figure 14:
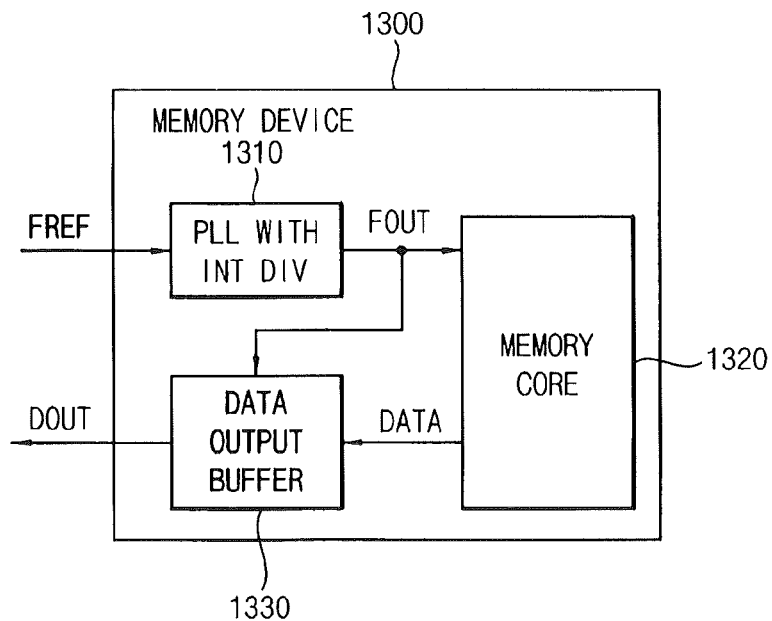
FIG. 14 is a block diagram illustrating a memory device including a phase locked loop according to example embodiments.

FIG. 14 is a block diagram illustrating a memory device including a phase locked loop according to example embodiments.

Referring to FIG. 14, a memory device 1300 includes a PLL 1310, a memory core 1320 and a data output buffer 1330. According to example embodiments, the memory device 1300 may be a dynamic random access memory (DRAM), a mobile DRAM, a static random access memory (SRAM), an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. For example, the memory device 1300 may be a DDR synchronous dynamic random access memory (SDRAM) or a graphic double data rate (GDDR) synchronous dynamic random access memory (SDRAM).

The PLL 1310 may generate an output signal FOUT having a desired frequency based on a reference signal FREF. The PLL 1310 may generate the output signal FOUT having the duty ratio of about 50:50 with respect to both the odd number frequency division operation and the even number frequency division operation, without an additional DCC, and thus may have relatively improved operational performance, relatively simple structure and relatively low power consumption.

The memory core 1320 may perform a write operation that stores data provided from a data input buffer (not shown), and may perform a read operation that provides the stored data DATA to the data output buffer 1330. The memory core 1320 may perform the write operation and/or the read operation based on the output signal FOUT of the PLL 1310. The memory core 1320 may include a memory cell array having a plurality of memory cells for storing data, row and column decoders selecting a wordline and a bitline of the memory cell array based on an address signal, and a sense amplifier sensing the data stored in selected memory cells.

The data output buffer 1330 may output the data DATA provided from the memory core 1320 as output data DOUT in response to the output signal FOUT of the PLL 1310. The output data DOUT may be synchronized with the output signal FOUT of the PLL 1310, and may be provided to an external device, such as a memory controller.

Figure 15:
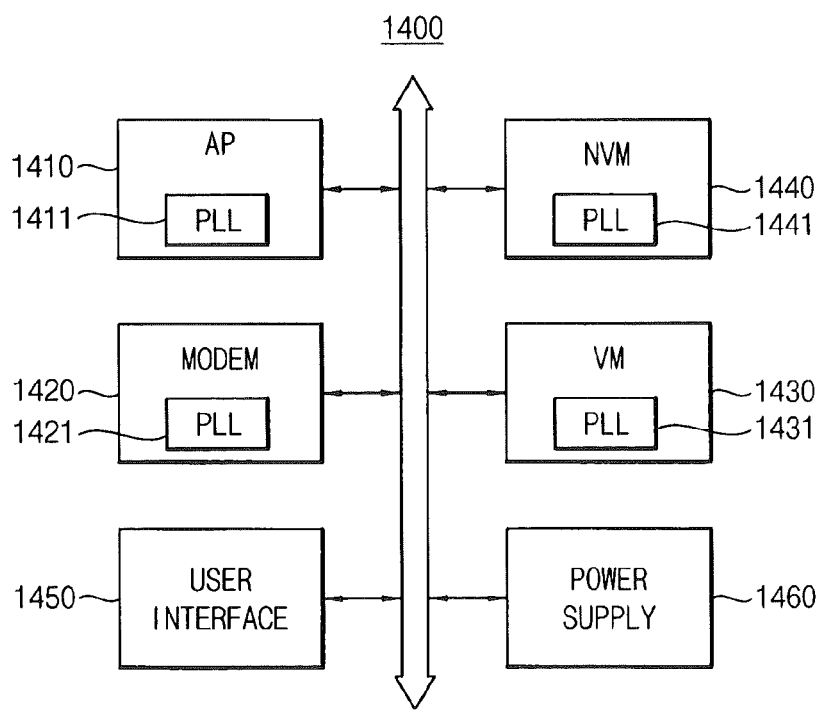
FIG. 15 is a block diagram illustrating a mobile system according to example embodiments.

FIG. 15 is a block diagram illustrating a mobile system according to example embodiments.

Referring to FIG. 15, a mobile system 1400 includes an application processor 1410, a modem 1420, a volatile memory device 1430, a nonvolatile memory device 1440, a user interface 1450 and a power supply 1460. According to example embodiments, the mobile system 1400 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation system, etc.

The application processor 1410 may execute applications, such as an internet browser, a game application, a video player application, etc. The application processor 1410 may include a first PLL 1411. The application processor 1410 may operate based on a clock signal generated by the first PLL 1411. According to example embodiments, the application processor 1410 may include a single processor core or a plurality of processor cores. For example, the application processor 1410 may be a multi-core processor, such as a dual-core processor, a quad-core processor, a hexa-core processor, etc. For example, assuming that the application processor 1410 is an ARM processor, the application processor 1410 may be implemented with the single-core processor when the application processor 1410 operates with relatively low speed (e.g., lower than about 1 GHz), and may be implemented with the multi-core processor when the application processor 1410 operates with relatively high speed (e.g., higher than about 1 GHz). For example, the multi-core ARM processor may be connected to the peripheral devices (e.g., the modem 1420, the volatile memory device 1430, the nonvolatile memory device 1440 and the user interface 1450) via an advanced extensible interface (AXI) bus. In some example embodiments, the application processor 1410 may further include a cache memory located inside or outside the application processor 1410.

The modem 1420 may perform wired or wireless communication with an external device. For example, the modem 1420 may perform a USB communication, an Ethernet communication, a near field communication (NFC), a radio frequency identification (RFID) communication, a mobile telecommunication, a memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. The modem 1420 may include a baseband chipset. The modem 1420 may further include a second PLL 1421.

The volatile memory device 1430 may store an instruction/data processed by the application processor 1410, or may serve as a working memory. For example, the volatile memory device 1430 may be implemented by a dynamic random access memory (DRAM), a static random access memory (SRAM), a mobile DRAM, or the like. The volatile memory device 1430 may include a third PLL 1431.

The nonvolatile memory device 1440 may store a boot image for booting the mobile system 1400. For example, the nonvolatile memory device 1440 may be implemented by an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like. The nonvolatile memory device 1440 may include a fourth PLL 1441

The first, second, third and fourth PLL 1411, 1421, 1431 and 1441 may be used for frequency synthesis, clock recovery, clock generation, spread spectrum, clock distribution, de-skewing, jitter and noise reduction, etc. Each of the first, second, third and fourth PLL 1411, 1421, 1431 and 1441 may generate an output signal (e.g., a clock signal) having the duty ratio of about 50:50 with respect to both the odd number frequency division operation and the even number frequency division operation, without an additional DCC, and thus may have relatively improved operational performance, relatively simple structure and relatively low power consumption.

The user interface 1450 may include at least one input device, such as a keypad, a touch screen, etc., and at least one output device, such as a display device, a speaker, etc. The power supply 1460 may supply the mobile system 1400 with power. In some example embodiments, the mobile system 1400 may further include a camera image processor (CIS), storage device, such as a memory card, a solid state drive (SDD), a CD-ROM, etc.

According to example embodiments, the mobile system 1400 and/or components of the mobile system 1400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 16:
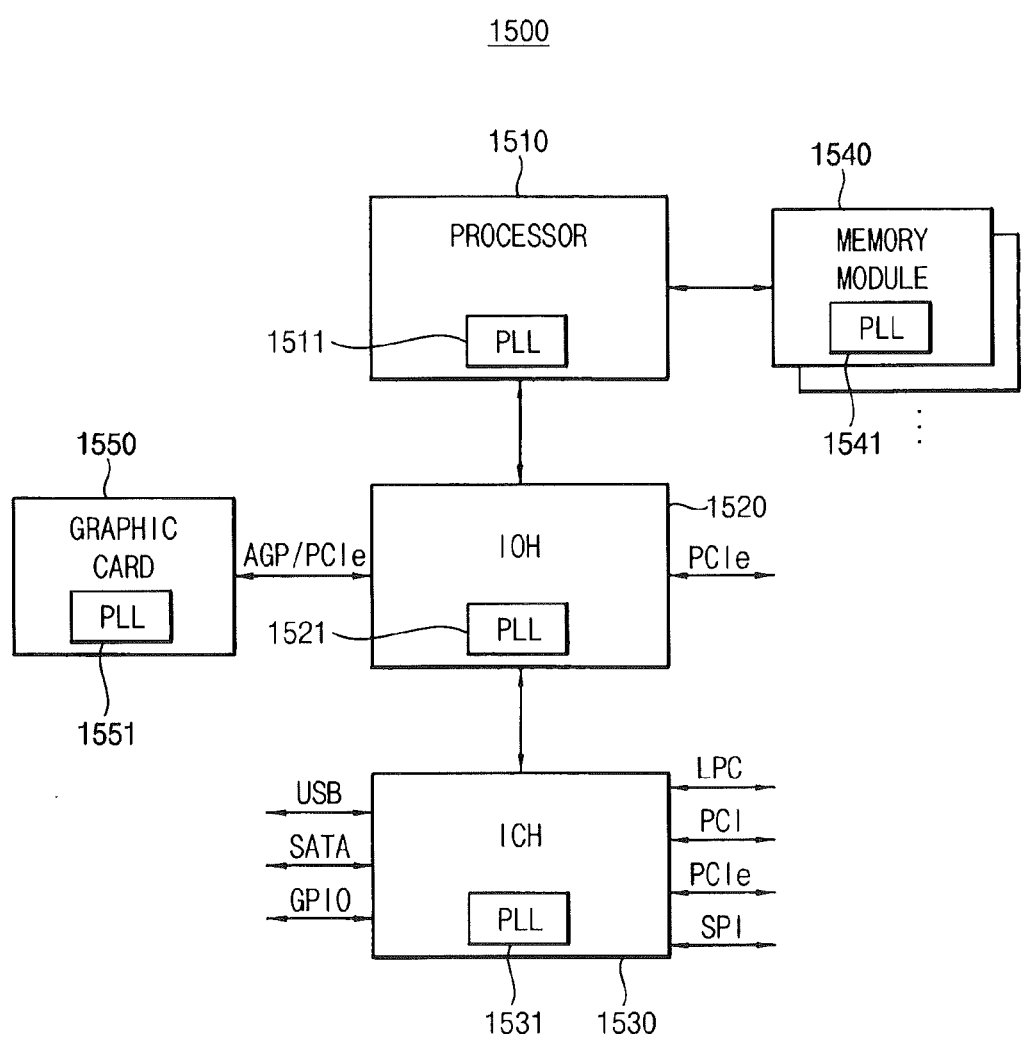
FIG. 16 is a block diagram illustrating a computing system according to example embodiments.

FIG. 16 is a block diagram illustrating a computing system according to example embodiments.

Referring to FIG. 16, a computing system 1500 includes a processor 1510, an input/output hub 1520, an input/output controller hub 1530, at least one memory module 1540 and a graphic card 1550. According to example embodiments, the computing system 1500 may be any computing system, such as a personal computer (PC), a server computer, a workstation, a tablet computer, a laptop computer, a mobile phone, a smart phone, a personal digital assistant (PDA), a portable multimedia player (PMP), a digital camera, a digital television, a set-top box, a music player, a portable game console, a navigation device, etc.

The processor 1510 may perform specific calculations or tasks. For example, the processor 1510 may be a microprocessor, a central process unit (CPU), a digital signal processor, or the like. The processor 1510 may include a first PLL 1511. The processor 1510 may operate based on a clock signal generated by the first PLL 1511. According to example embodiments, the processor 1510 may include a single processor core or a plurality of processor cores. For example, the processor 1510 may be a multi-core processor, such as a dual-core processor, a quad-core processor, a hexa-core processor, etc. For example, assuming that the processor 1510 is an ARM processor, the processor 1510 may be implemented with the single-core processor when the processor 1510 operates with relatively low speed (e.g., lower than about 1 GHz), and may be implemented with the multi-core processor when the processor 1510 operates with relatively high speed (e.g., higher than about 1 GHz). For example, the multi-core ARM processor may be connected to the peripheral devices (e.g., the input/output hub 1520, the input/output controller hub 1530, the memory module 1540 and the graphic card 1550) via an AXI bus. Although FIG. 16 illustrates an example of the computing system 1500 including one processor 1510, according to example embodiments, the computing system 1500 may include a plurality of processors. In some example embodiments, the processor 1510 may further include a cache memory located inside or outside the processor 1510.

The processor 1510 may include a memory controller (not shown) that controls an operation of the memory module 1540. The memory controller included in the processor 1510 may be referred to as an integrated memory controller (IMC). A memory interface between the memory controller and the memory module 1540 may be implemented by one channel including a plurality of signal lines, or by a plurality of channels. Each channel may be coupled to at least one memory module 1540. In some example embodiments, the memory controller may be included in the input/output hub 1520. The input/output hub 1520 including the memory controller may be referred to as a memory controller hub (MCH).

The memory module 1540 may include a plurality of memory devices that store data provided from the memory controller. The memory module 1540 may include a fourth PLL 1541. In some example embodiments, the fourth PLL 1541 may be disposed on the memory module 1540, and may be used to operate a buffer between the memory controller and the memory devices. In other example embodiments, the PLL 1541 may be disposed on each memory device, and may be used to operate each memory device.

The input/output hub 1520 may manage data transfer between the processor 1510 and devices, such as the graphic card 1550. The input/output hub 1520 may include a second PLL 1521. The input/output hub 1520 may be coupled to the processor 1510 via at least one of various interfaces, such as a front side bus (FSB), a system bus, a HyperTransport, a lightning data transport (LDT), a QuickPath interconnect (QPI), a common system interface (CSI), etc. Although FIG. 16 illustrates an example of the computing system 1500 including one input/output hub 1520, according to example embodiments, the computing system 1500 may include a plurality of input/output hubs.

The input/output hub 1520 may provide various interfaces with the devices. For example, the input/output hub 1520 may provide an accelerated graphics port (AGP) interface, a peripheral component interface-express (PCIe), a communications streaming architecture (CSA) interface, etc.

The graphic card 1550 may be coupled to the input/output hub 1520 via the AGP or the PCIe. The graphic card 1550 may control a display device (not shown) for displaying an image. The graphic card 1550 may include an internal processor and an internal memory to process the image. The graphic card 1550 may further include a fifth PLL 1551. In some example embodiments, the input/output hub 1520 may include an internal graphic device along with or instead of the graphic card 1550. The internal graphic device may be referred to as an integrated graphics, and an input/output hub including the memory controller and the internal graphic device may be referred to as a graphics and memory controller hub (GMCH).

The input/output controller hub 1530 may perform data buffering and interface arbitration to efficiently operate various system interfaces. The input/output controller hub 1530 may include a third PLL 1531.

The first, second, third, fourth and fifth PLL 1511, 1521, 1531, 1541 and 1551 may be used for frequency synthesis, clock recovery, clock generation, spread spectrum, clock distribution, de-skewing, jitter and noise reduction, etc. Each of the first, second, third, fourth and fifth PLL 1511, 1521, 1531, 1541 and 1551 may generate an output signal (e.g., a clock signal) having the duty ratio of about 50:50 with respect to both the odd number frequency division operation and the even number frequency division operation, without an additional DCC, and thus may have relatively improved operational performance, relatively simple structure and relatively low power consumption.

The input/output controller hub 1530 may be coupled to the input/output hub 1520 via an internal bus. For example, the input/output controller hub 1530 may be coupled to the input/output hub 1520 via at least one of various interfaces, such as a direct media interface (DMI), a hub interface, an enterprise Southbridge interface (ESI), PCIe, etc.

The input/output controller hub 1530 may provide various interfaces with peripheral devices. For example, the input/output controller hub 1530 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In some example embodiments, the processor 1510, the input/output hub 1520 and the input/output controller hub 1530 may be implemented as separate chipsets or separate integrated circuits. In other embodiments, at least two of the processor 1510, the input/output hub 1520 and the input/output controller hub 1530 may be implemented as one chipset.

The above described embodiments may be used in any device or system including a phase locked loop, such as a mobile phone, a smart phone, a personal digital assistant (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

As described above, the inventive concept may substantially obviate one or more problems due to limitations and disadvantages of the related art. Some example embodiments provide a frequency divider capable of effectively generating various frequency-divided signals of odd number division ratios and even number division ratios at a duty ratio of about 50:50. Some example embodiments provide a phase locked loop (PLL) including the frequency divider.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A frequency divider, comprising:
a first edge detection unit configured to generate a first count signal responsive to detecting first edges of an input signal based on a division control signal;
a second edge detection unit configured to generate a second count signal responsive to detecting either the first edges of the input signal or second edges of the input signal based on a selection signal and the division control signal, wherein the second edge is different from the first edge;
a pulse triggered buffer unit configured to generate an output signal by controlling a logic level of an output node based on the first count signal and the second count signal, the output signal being divided by a target division ratio with respect to the input signal based on the selection signal and the division control signal; and
a mode selection unit configured to set the target division ratio to an odd number division ratio or an even number division ratio based on the selection signal.

2. The frequency divider of claim 1, wherein the output signal has a duty ratio of about 50:50 both when the target division ratio is set to the odd number division ratio and when the target division ratio is set to the even number division ratio.

3. The frequency divider of claim 1, wherein the target division ratio is set to the odd number division ratio and the frequency divider operates in a first operation mode when the selection signal has a first logic level, and wherein the target division ratio is set to the even number division ratio and the frequency divider operates in a second operation mode when the selection signal has a second logic level, different from the first logic level and wherein one of the first and second edges comprises a rising edge and the other of the first and second edges comprises a falling edge.

4. The frequency divider of claim 3, wherein the second edge detection unit generates the second count signal responsive to detecting the second edges of the input signal in the first operation mode, and wherein the second edge detection unit generates the second count signal responsive to detecting the first edges of the input signal in the second operation mode.

5. The frequency divider of claim 4, wherein the output signal transitions from the second logic level to the first logic level based on the first count signal, and wherein the output signal transitions from the first logic level to the second logic level based on the second count signal.

6. The frequency divider of claim 3, wherein the first edge detection unit includes a first shift register and the second edge detection unit includes a second shift register, and wherein:
the first shift register including a plurality of first flip-flops cascade connected, and configured to operate in response to the first edges of the input signal,
the second shift register including a plurality of second flip-flops cascade connected, configured to operate in response to the second edges of the input signal in the first operation mode and configured to operate in response to the first edges of the input signal in the second operation mode.

7. The frequency divider of claim 6, wherein each of the first shift register and the second shift register includes n flip-flops, where n is a natural number equal to or greater than one, and wherein the target division ratio is (2n−1) in the first operation mode and is 2n in the second operation mode.

8. The frequency divider of claim 3,
wherein the first edge detection unit includes a first counter configured to generate the first count signal by counting the first edges of the input signal, the first count signal being activated when a predetermined number of the first edges of the input signal are counted, and
wherein the second edge detection unit includes a second counter configured to generate the second count signal by counting either the first edges of the input signal or the second edges of the input signal, the second count signal being activated in the first operation mode when the predetermined number of the second edges of the input signal are counted, and the second count signal being activated in the second operation mode when the predetermined number of the first edges of the input signal are counted.

9. The frequency divider of claim 3, wherein the pulse triggered buffer unit includes:
a driving signal generation unit configured to generate a first driving signal based on the first count signal and configured to generate a second driving signal based on the second count signal;
a driving unit configured to change the logic level of the output node from the second logic level to the first logic level responsive to the first driving signal, and configured to change the logic level of the output node from the first logic level to the second logic level responsive to the second driving signal; and
a latch unit configured to maintain the logic level of the output node.

10. The frequency divider of claim 9, wherein the driving signal generation unit includes:
a first delay unit configured to generate a first delay signal by delaying the first count signal;
a second delay unit configured to generate a second delay signal by delaying the second count signal;
a first logic gate configured to generate the first driving signal by performing a first logical operation on the first count signal and the first delay signal; and
a second logic gate configured to generate the second driving signal by performing a second logical operation on the second count signal and the second delay signal.

11. The frequency divider of claim 10, wherein the driving unit includes:
a p-type metal oxide semiconductor (PMOS) transistor having a first node connected to a power supply voltage, a gate node coupled to the first driving signal, and a second node connected to the output node; and a n-type metal oxide semiconductor (NMOS) transistor having a first node connected to the output node, a gate node coupled to the second driving signal, and a second node connected to a ground voltage.

12. The frequency divider of claim 3, wherein the mode selection unit includes:
an inverter configured to generate an inversion signal of the input signal by inverting the input signal; and
a multiplexer configured to provide the inversion signal of the input signal to the second edge detection unit based on the selection signal in the first operation mode and configured to provide the input signal to the second edge detection unit based on the selection signal in the second operation mode.

13. The frequency divider of claim 1, further comprising:
a reset signal generation unit configured to generate a first reset signal resetting the first count signal and a second reset signal resetting the second count signal based on the output signal, the first reset signal and the second reset signal being alternately activated.

14. The frequency divider of claim 13, wherein the reset signal generation unit includes:
a delay unit configured to generate the second reset signal by delaying the output signal; and
an inverter configured to generate the first reset signal by inverting the second reset signal.

15. A phase locked loop (PLL), comprising:
a phase frequency detector configured to generate an up signal and a down signal corresponding to a phase difference and a frequency difference between a reference signal and a feedback signal;
a charge pump configured to generate a control current based on the up signal and the down signal;
a loop filter configured to generate a control voltage by filtering the control current;
a voltage controlled oscillator configured to generate an oscillation signal based on the control voltage;
a first frequency divider configured to generate the feedback signal by dividing the oscillation signal; and
a second frequency divider configured to generate an output signal by dividing the oscillation signal, the second frequency divider including:
a first edge detection unit configured to generate a first count signal by detecting first edges of the oscillation signal based on a division control signal;
a second edge detection unit configured to generate a second count signal by detecting the first edges of the oscillation signal or second edges of the oscillation signal based on a selection signal and the division control signal;
a pulse triggered buffer unit configured to generate the output signal by controlling a logic level of an output node based on the first count signal and the second count signal, the output signal being divided by a target division ratio with respect to the oscillation signal; and a mode selection unit configured to set the target division ratio to an odd number division ratio or an even number division ratio based on the selection signal.

16. A frequency divider, comprising:
a first edge detection unit configured to generate a first count signal responsive to detecting first edges of an input signal;
a second edge detection unit configured to generate a second count signal responsive to detecting the first edges of the input signal in a first operation mode and to generate the second count signal responsive to detecting second edges, of a different type from the first edges, of the input signal in a second operation mode, wherein one of the first and second edges is a rising edge type and another of the first and second edges is a failing edge type;
a pulse triggered buffer unit configured to generate an output signal responsive to the first count signal and the second count signal, the output signal being divided by a target division ratio with respect to the input signal that is an odd number division ratio in one of the first operation mode or the second operation mode and an even number division ratio in another of the first operation mode or the second operation mode.

17. The frequency divider of claim 16, wherein the target division ratio in the first operation mode comprises the even number division ratio and the target division ratio in the second operation mode comprises the odd number division ratio.

18. The frequency divider of claim 17, wherein the first edge detection unit and the second edge detection circuit are further configured to generate their respective count signals responsive to a division control signal to provide a selectable even numbered division ratio in the first operation mode and a selectable odd numbered division ratio in the second operation mode.

19. A frequency divider circuit including the frequency divider of claim 18 as a first frequency divider and the output signal of the pulse triggered buffer comprises a first output signal and further comprising:
a second frequency divider configured to generate only an even number division ratio second output signal based on the input signal; and
an output circuit configured to selectively provide the second output signal as a selected output signal for the frequency divider circuit when a desired output signal has an even number division ratio of greater than a selection level and to otherwise provide the first output signal as the selected output signal.

20. The frequency divider of claim 18, further comprising a mode selection unit coupled to the input signal that is configured to select the first or second operation mode responsive to a selection signal, wherein the mode selection unit includes an inverter that generates an inverted input signal and the mode selection unit is configured to selectably output the input signal or the inverted input signal to the second edge detection unit responsive to the selection signal.

* * * * *